(12) United States Patent
Kim et al.

(10) Patent No.: US 8,884,440 B2
(45) Date of Patent: Nov. 11, 2014

(54) INTEGRATED CIRCUIT DEVICE INCLUDING THROUGH-SILICON VIA STRUCTURE HAVING OFFSET INTERFACE

(75) Inventors: Su-kyoung Kim, Suwon-si (KR);
Gil-heyun Choi, Seoul (KR);
Byung-lyul Park, Seoul (KR);
Kwang-jin Moon, Hwaseong-si (KR);
Kun-sang Park, Hwaseong-si (KR);
Dong-chan Lim, Gangneung-si (KR);
Do-sun Lee, Gwangju (KR)

(73) Assignee: Samsung Electronics Co., Ltd. (KR)

( * ) Notice: Subject to any disclaimer, the term of this patent is extended or adjusted under 35 U.S.C. 154(b) by 148 days.

(21) Appl. No.: 13/603,978

(22) Filed: Sep. 5, 2012

(65) Prior Publication Data
US 2013/0119547 A1 May 16, 2013

(30) Foreign Application Priority Data

Nov. 15, 2011 (KR) .................. 10-2011-0119124

(51) Int. Cl.
| | | |
|---|---|---|
| H01L 23/52 | (2006.01) | |
| H01L 23/48 | (2006.01) | |
| H01L 29/40 | (2006.01) | |
| H01L 23/538 | (2006.01) | |
| H01L 21/768 | (2006.01) | |
| H01L 25/065 | (2006.01) | |
| H01L 23/498 | (2006.01) | |

(52) U.S. Cl.
CPC ........ *H01L 21/76898* (2013.01); *H01L 23/481* (2013.01); *H01L 25/0657* (2013.01); *H01L 23/49827* (2013.01); *H01L 2224/16* (2013.01)
USPC ..... 257/774; 257/751; 257/621; 257/E23.174

(58) Field of Classification Search
CPC .............. H01L 23/481; H01L 25/0657; H01L 23/49827; H01L 21/76898; H01L 2224/16
USPC ........................... 257/774, 751, 621, E23.538
See application file for complete search history.

(56) References Cited

U.S. PATENT DOCUMENTS

| | | | |
|---|---|---|---|
| 7,541,677 B2 * | 6/2009 | Kawano ........................ 257/758 |
| 7,629,249 B2 | 12/2009 | Borthakur | |
| 8,039,385 B1 * | 10/2011 | West et al. ..................... 438/613 |
| 8,084,866 B2 * | 12/2011 | Hiatt et al. ..................... 257/774 |
| 8,138,036 B2 * | 3/2012 | Andry et al. .................. 438/199 |
| 8,304,863 B2 * | 11/2012 | Filippi et al. .................. 257/621 |
| 8,354,678 B1 * | 1/2013 | Fox et al. ........................ 257/77 |
| 2011/0108988 A1 | 5/2011 | Lim et al. | |

FOREIGN PATENT DOCUMENTS

JP 2007-5404 A 1/2007

* cited by examiner

*Primary Examiner* — Luan C Thai
(74) *Attorney, Agent, or Firm* — Myers Bigel Sibley & Sajovec, P.A.

(57) ABSTRACT

An integrated circuit device includes a substrate through which a first through-hole extends, and an interlayer insulating film on the substrate, the interlayer insulating film having a second through-hole communicating with the first through-hole. A Through-Silicon Via (TSV) structure is provided in the first through-hole and the second through-hole. The TSV structure extends to pass through the substrate and the interlayer insulating film. The TSV structure comprises a first through-electrode portion having a top surface located in the first through-hole, and a second through-electrode portion having a bottom surface contacting with the top surface of the first through-electrode portion and extending from the bottom surface to at least the second through-hole. Related fabrication methods are also described.

19 Claims, 33 Drawing Sheets

INTEGRATED CIRCUIT DEVICE INCLUDING THROUGH-SILICON VIA STRUCTURE HAVING OFFSET INTERFACE

CROSS-REFERENCE TO RELATED APPLICATION

This application claims the benefit of Korean Patent Application No. 10-2011-0119124, filed on Nov. 15, 2011, in the Korean Intellectual Property Office, the disclosure of which is incorporated herein in its entirety by reference.

BACKGROUND

The inventive concept relates to integrated circuit devices, and more particularly, to integrated circuit devices including Through-Silicon Via (TSV) structures. It will be understood that, as used herein, the term "TSV" includes any conductive via structure that extends through a substrate, regardless of whether the substrate comprises silicon.

Three-dimensional (3D) semiconductor packages including stacked semiconductor chips are being actively developed. These 3D packages may use a Through-Silicon Via (TSV) that is a vertical electrical connection passing through a substrate or a die.

SUMMARY

The inventive concept provides integrated circuit devices including stable through-silicon via (TSV) structures that can reduce or prevent delamination between different films thereof and allow improved reliability.

According to an aspect of the inventive concept, there is provided an integrated circuit device including a substrate through which a first through-hole extends, and an interlayer insulating film on the substrate. The interlayer insulating film has a second through-hole communicating with the first through-hole. A Through-Silicon Via (TSV) structure is provided in the first through-hole and the second through-hole, the TSV structure extending to pass through the substrate and the interlayer insulating film. The TSV structure includes a first through-electrode portion having a top surface located in the first through-hole and a second through-electrode portion having a bottom surface contacting with the top surface of the first through-electrode portion and extending from the bottom surface to at least the second through-hole.

The first through-electrode portion may include a first conductive plug having a first metal, and the second through-electrode portion may have a second conductive plug having a second metal different from the first metal.

The second conductive plug may further include a third metal different from the first metal and the second metal.

The first conductive plug may include copper (Cu), and the second conductive plug includes molybdenum (Mo), tantalum (Ta), tungsten (W) and/or nickel (Ni).

The TSV structure may further include a first barrier film extending from the first through-hole to at least the second through-hole, wherein the first through-electrode portion has a first conductive plug having a side wall surrounded by the first barrier film and including a first metal, and wherein the second through-electrode portion has a second conductive plug having a side wall surrounded by the first barrier film and including a second metal.

The second through-electrode portion may further have a second barrier film surrounding at least a portion of the second conductive plug and contacting with a top surface of the first conductive plug and with the first barrier film.

The first barrier film and the second barrier film may include different materials.

The first metal and the second metal may be the same.

The first conductive plug may include Cu, and the second conductive plug may include Cu and/or W.

The second through-electrode portion may have a top surface located at a same level as a level of a top surface of the interlayer insulating film The second through-electrode portion may have a top surface located at a level higher than a level of a top surface of the interlayer insulating film.

The integrated circuit device may further include an inter-metal insulating film on the interlayer insulating film; and a multi-layer wiring pattern for through-electrode at a same level as a level of the inter-metal insulating film, the multi-layer wiring pattern for through-electrode being electrically connected to the second through-electrode portion.

The integrated circuit device may further include an inter-metal insulating film on the interlayer insulating film, wherein the second through-electrode portion extends from the bottom surface of the second through-electrode portion through the second through-hole to pass through the inter-metal insulating film.

According to another aspect of the inventive concept, there is provided an integrated circuit device including a package substrate having a connection terminal, at least one semiconductor chip having a substrate stacked on the package substrate, an interlayer insulating film on the substrate, and a Through-Silicon Via (TSV) structure passing through the substrate and the interlayer insulating film. The TSV structure is electrically connected to the connection terminal. The TSV structure includes a barrier film passing through the substrate and the interlayer insulating film, a first through-electrode portion having a side wall surrounded by the barrier film, and a second through-electrode portion having a side wall surrounded by the barrier film and extending from a top surface of the first through-electrode portion to at least a top surface of the interlayer insulating film.

The first through-electrode portion may include a first metal, and the second through-electrode portion may include a second metal different from the first metal.

According to another aspect of the inventive concept, there is provided an integrated circuit device comprising a substrate and an insulating layer on the substrate, to define a substrate outer face, an insulating layer outer face and a device interface therebetween. A Through-Silicon Via (TSV) structure is provided that passes through the substrate and the insulating layer. The TSV structure comprises a first plug that extends from adjacent the substrate outer face towards the insulating layer outer face and a second plug that extends from adjacent the insulating layer outer face towards the substrate outer face to define a plug interface therebetween that is offset from the device interface.

In some embodiments, the electrode interface is between the substrate outer face and the device interface. Moreover, in some embodiments, the first and second electrodes comprise different materials. A barrier layer may also be provided on side walls of the first and second electrodes. In other embodiments, the insulating layer comprises an interlayer insulating film, the integrated circuit device further comprising an inter-metal insulating film on the interlayer insulating film to define an inter-metal insulating film outer face, wherein the second plug further extends from adjacent the inter-metal insulating film outer face and through the inter-metal insulating film.

BRIEF DESCRIPTION OF THE DRAWINGS

Various embodiments of the inventive concept will be more clearly understood from the following detailed description taken in conjunction with the accompanying drawings in which.

DETAILED DESCRIPTION OF THE EMBODIMENTS

Figure 1A:
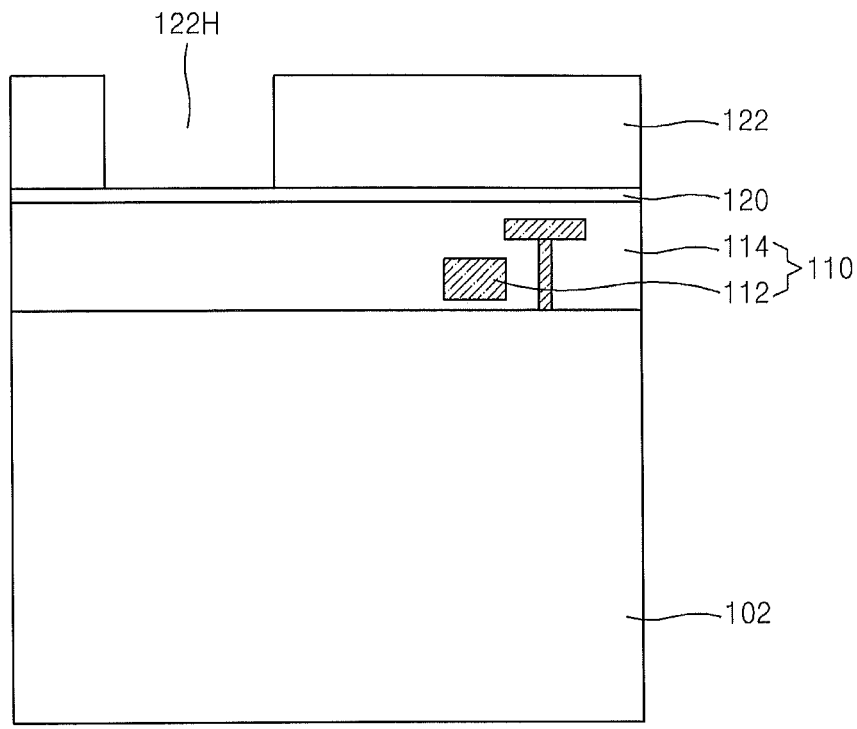
FIGS. 1A through 1M are cross-sectional views illustrating a method of manufacturing an integrated circuit device and an integrated circuit device so manufactured, according to various embodiments of the inventive concept.

The inventive concept will now be described more fully with reference to the accompanying drawings, in which various embodiments of the inventive concept are shown. The same elements in the drawings are denoted by the same reference numerals and a repeated explanation thereof will not be given.

The inventive concept now will be described more fully hereinafter with reference to the accompanying drawings, in which elements of the inventive concept are shown. The inventive concept may, however, be embodied in many different forms and should not be construed as limited to the exemplary embodiments set forth herein. Rather, these embodiments are provided so that this disclosure will be thorough and complete, and will fully convey the scope of the inventive concept to one of ordinary skill in the art.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept. For example, a first element may be named a second element and similarly a second element may be named a first element without departing from the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In other embodiments, a specific order of processes may be changed. For example, two processes which are continuously explained may be substantially simultaneously performed and may be performed in an order opposite to that explained.

Variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments described herein only and is not intended to be limiting of the example embodiments described herein. As used herein, the singular forms "a," "an" and "the" are intended to include the plural forms as well, unless the context clearly indicates otherwise. It will be further understood that the terms "comprises," "comprising," "includes," "including," "have" and/or "having" when used in this specification, specify the presence of stated features, integers, steps, operations, elements, and/or components, but do not preclude the presence or addition of one or more other features, integers, steps, operations, elements, components, and/or groups thereof.

FIGS. 1A through 1M are cross-sectional views illustrating a method of manufacturing an integrated circuit device 10 according to an embodiment of the inventive concept, and an integrated circuit device so manufactured.

Referring to FIG. 1A, a front-end-of-line (FEOL) structure 110 is formed on a substrate 102, a first polish-stop layer 120 is formed on the FEOL structure 110, and a mask pattern 122 is formed on the first polish-stop layer 120. A hole 122H through which a top surface of the first polish-stop layer 120 is partially exposed is formed in the mask pattern 122.

In some embodiments, the substrate 102 is a semiconductor wafer. In at least one embodiment, the substrate 102 includes silicon (Si). In another embodiment, the substrate 102 may include a semiconductor element such as germanium (Ge), or a compound semiconductor such as silicon carbide (SiC), gallium arsenide (GaAs), indium arsenide (InAs), or indium phosphide (InP). In at least one embodiment, the substrate 102 may have a silicon-on-insulator (SOI) structure. For example, the substrate 102 may include a buried oxide (BOX) layer. In some embodiments, the substrate 102 may include a conductive region, for example, a well doped with impurities or a structure doped with impurities. Also, the substrate 102 may have any of various device isolation structures such as a shallow trench isolation (STI) structure.

The FEOL structure 110 includes various types of individual devices 112 and an interlayer insulating film 114. The plurality of individual devices 112 may include microelectronic devices, for example, a metal-oxide-semiconductor field effect transistor (MOSFET) such as a complementary metal-oxide-semiconductor (CMOS) transistor, a system large scale integration (LSI), an image sensor such as a CMOS imaging sensor (CIS), an active device, and/or a passive device. The plurality of individual devices 112 may be electrically connected to the conductive region of the substrate 102. Also, the plurality of individual devices 112 may be electrically isolated from one another due to the interlayer insulating film 114.

In some embodiments, the first polish-stop layer 120 may be a silicon nitride film. The first polish-stop layer 120 may be formed to have a thickness of about 200 to 1000 Å. In order to form the first polish-stop layer 120, chemical vapor deposition (CVD) may be used.

The mask pattern 122 may be formed of a photoresist material.

Figure 1B:
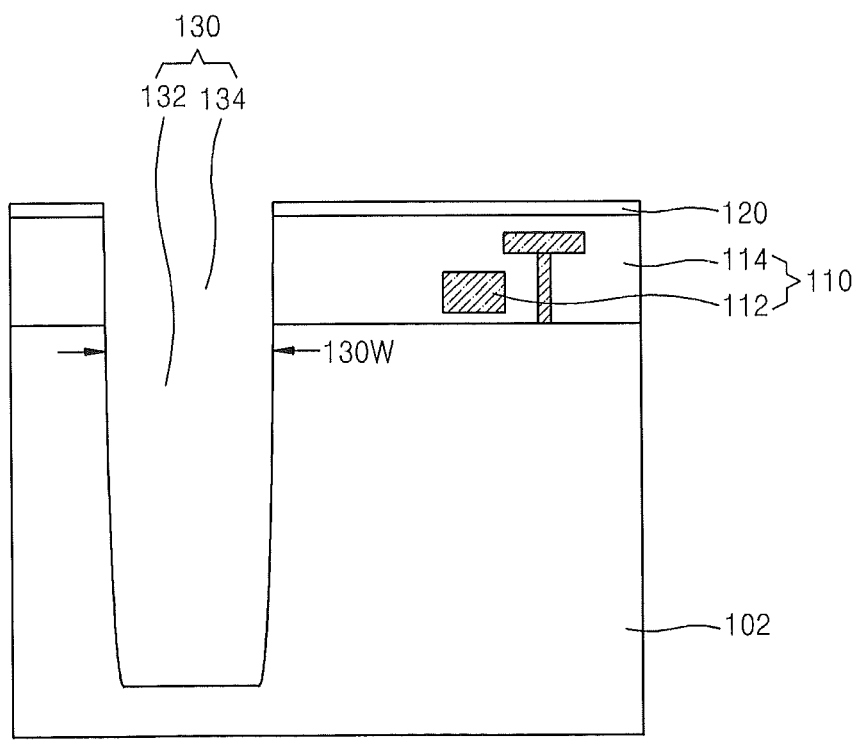

Referring to FIG. 1B, a via hole 130 is formed by etching the first polish-stop layer 120 and the interlayer insulating film 114 by using the mask pattern 122 as an etching mask, and then etching the substrate 102. The via hole 130 includes a first hole 132 formed to a predetermined depth in the substrate 102 and a second hole 134 formed to pass through the interlayer insulating film 114 and communicate with the first hole 132.

In order to form the via hole 130, anisotropic etching and/or laser drilling may be used. In some embodiments, the via hole 130 may be formed in the substrate 102 to have a width 130 W of about 6 µm. In some embodiments, the via hole 130 may be formed to have a depth of about 60 µm from a top surface of the interlayer insulating film 114. However, the width and the depth of the via hole 130 are not limited thereto, and may vary as desired. The substrate 102 is exposed through the first hole 132 of the via hole 130, and the interlayer insulating film 114 is exposed through the second hole 134 of the via hole 130.

After the via hole 130 is formed, the top surface of the first polish-stop layer 120 is exposed by removing the mask pattern 122.

Figure 1C:
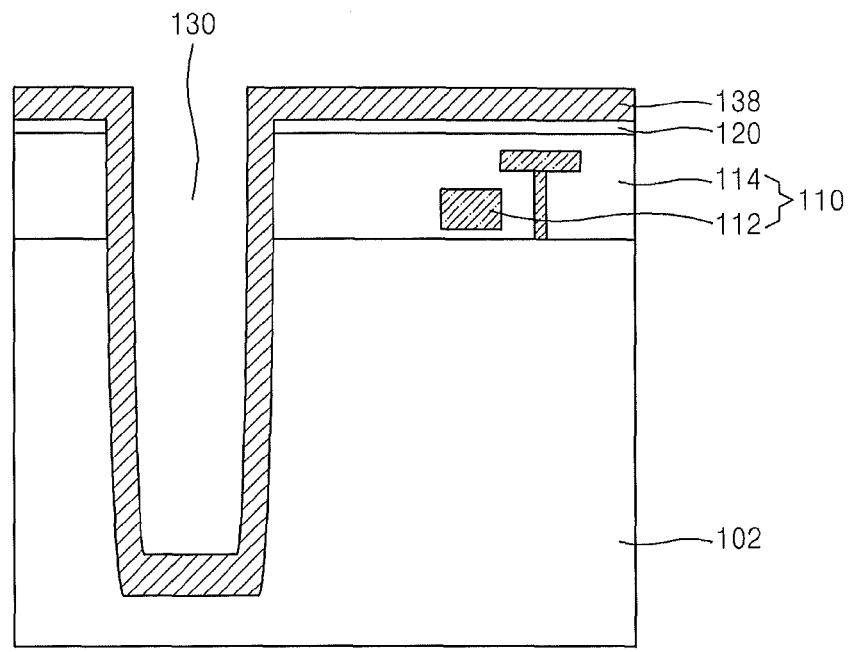

Referring to FIG. 1C, an insulating film 138 that covers an inner side wall and a bottom surface of the via hole 130 is formed.

The insulating film 138 may be formed to cover to a uniform thickness a surface of a portion of the substrate 102, a surface of a portion of the interlayer insulating film 114, and a surface of a portion of the first polish-stop layer 120 exposed through the via hole 130. In some embodiments, the insulating film 138 may be a silicon oxide film. In some embodiments, in order to form the insulating film 138, CVD may be used. The insulating film 138 may be formed to have a thickness of about 1500 to 2500 µm.

Figure 1D:
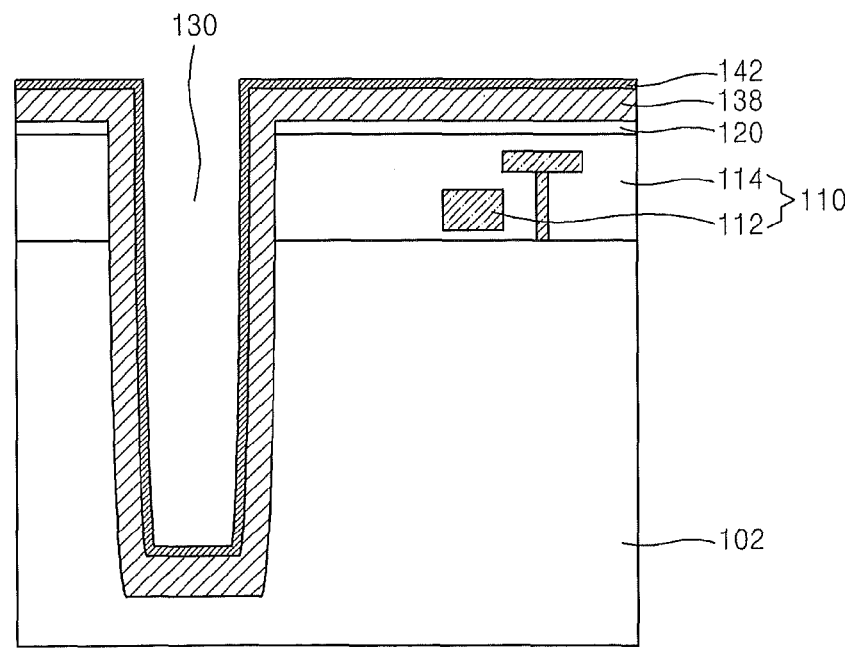

Referring to FIG. 1D, a first barrier film 142 is formed on the insulating film 138.

The first barrier film 142 extends to cover a bottom surface and a side wall of the first hole 132 and a side wall of the second hole 134 of the via hole 130, and a top surface of the insulating film 138. In some embodiments, the first barrier film 142 may include at least one material selected from titanium (Ti), titanium nitride (TiN), tantalum (Ta), or tantalum nitride (TaN). In some embodiments, in order to form the first barrier film 142, physical vapour deposition (PVD) may be used. In some embodiments, the first barrier film 142 may be formed to have locally different thicknesses. For example, the first barrier film 142 may be formed on the top surface of the insulating film 138 outside the via hole 130 to have a thickness of about 1000 to 2000 Å and may be formed on the insulating film 138 in the via hole 138 to have a thickness of about 40 to 50 Å.

Figure 1E:
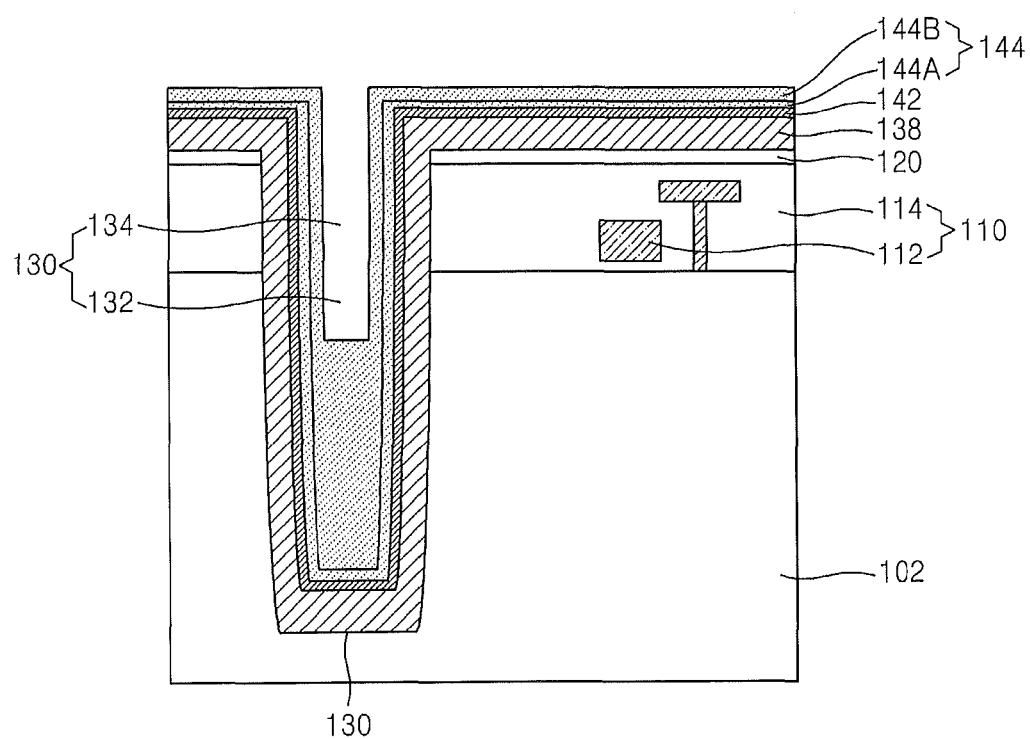

Referring to FIG. 1E, a first conductive layer 144 is formed on the first barrier film 142 to partially fill the first hole 132 in the via hole 130.

In some embodiments, the first conductive layer 144 may be a metal layer including copper (Cu). In some embodiments, in order to form the first conductive layer 144, a metal seed layer 144A, for example, a Cu seed layer, is formed on a surface of the first barrier film 142 by using PVD, and a metal layer 144*b* is formed on the metal seed layer 144*a* by using electroplating until the first hole 132 of the via hole 130 is partially filled. After the first conductive layer 144 is formed, the first hole 132 and the second hole 134 are not fully filled but leave blank areas.

If the metal seed layer 144A is formed by using PVD and the via hole 130 has a great depth, a surface roughness of the metal seed layer 144A at a portion in the second hole 134 close to an inlet of the via hole 130 may be greater than that at other portions. In this case, due to the undesirably rough surface of the metal seed layer 144A, after the metal layer 144B is formed on the seed layer 144A, voids may be formed between the metal seed layer 144A and the metal layer 144B in the second hole 134. In this case, if a TSV structure is formed in the via hole 130, the first conductive layer 144 may be delaminated from the surface of the first barrier film 142 because of the voids.

Figure 1F:
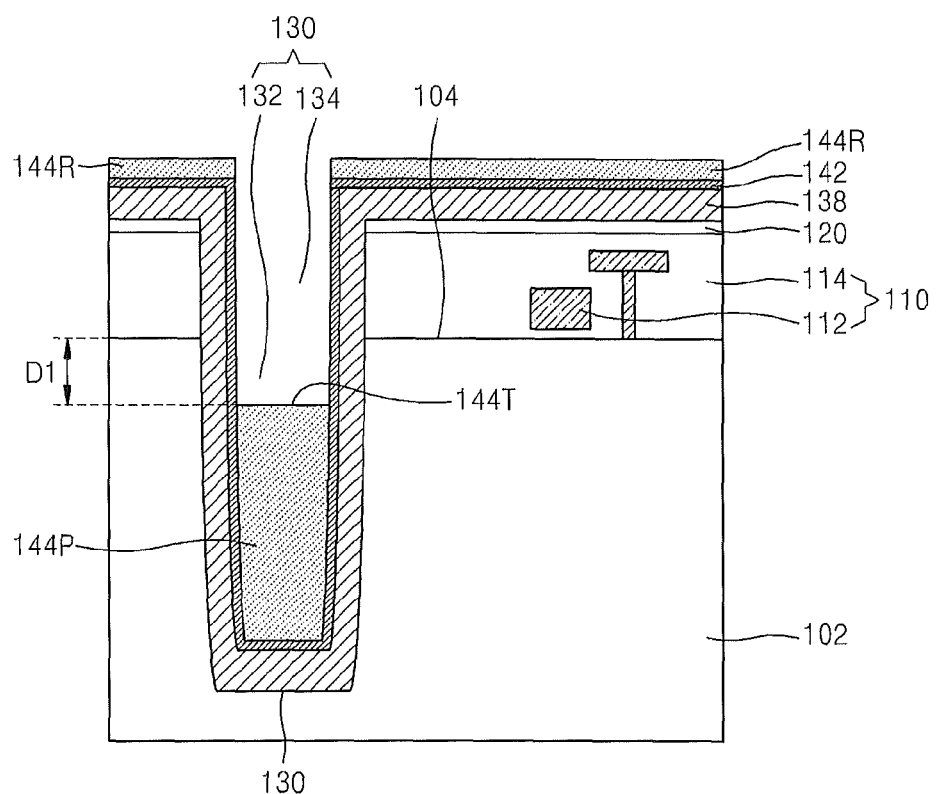

Referring to FIG. 1F, in order to prevent defects due to delamination of a TSV structure formed in the via hole 130, a portion of the first conductive layer 144 (see FIG. 1E) formed on an inner wall of the second hole 134 and a portion of the first conductive layer 144 formed on an inner wall of an upper portion of the first hole 132 are removed to form a first conductive plug 144P in the first hole 132. The first conductive plug 144P constitutes a first through-electrode portion.

In some embodiments, in order to remove the portion of the first conductive layer 144 formed on the inner wall of the second hole 134, reflow using heat is performed on a resultant structure including the first conductive layer 144. The reflow may be performed for about 10 to 20 minutes at a temperature of about 300 to 500° C. Due to the reflow, the metal seed layer 144A formed on the inner wall of the second hole 134 and the metal layer 144B covering the metal seed layer 144A reflow downward in the via hole 130. As a result, the first barrier film 142 is exposed in the second hole 134 and the upper portion of the first hole 132. As the metal seed layer 144A and the metal layer 144B reflow, the first conductive plug 144P that partially fills the first hole 132 from the bottom surface of the via hole 130 is formed in the via hole 130, and a metal residual layer 144R remains on a top surface of the first barrier film 142. The first conductive plug 144P has a top surface 144T located in the first hole 132. The top surface 144T of the first conductive plug 144P may be located at a level lower by a depth of D1 from a level of an interface 104 between the substrate 102 and the interlayer insulating film 114. For example, if the via hole 130 has a width of about 6 μm and a depth of about 60 μm, the depth D1 may be set to about 1.0 to 3.0 μm. However, the depth D1 illustrated in FIG. 1F is an example and the present embodiment is not limited thereto. The depth D1 may vary according to a design dimension of a device to be formed. For example, the top surface 144T may be lower than the interface 104 or may be higher than the interface 104. Alternatively, the top surface 144T may be located at substantially the same level as that of the interface 104. Although the top surface 144T is substantially flat in FIG. 1F, the present embodiment is not limited thereto. For example, the top surface 144T may have any of various shapes such as a planar shape, a concave shape, or a convex shape according to a process condition or a process atmosphere during the reflow, a width of the via hole 130, or a height of the via hole 130.

The first conductive plug 144P obtained as a result of the reflow includes metal grains that are sufficiently grown due to the reflow. If the first conductive layer 144 includes Cu, since Cu grains are sufficiently grown during the reflow, after a TSV structure is completely formed in the via hole 130, the TSV structure may be prevented from being deformed due to undesired growth of metal grains. For example, after a TSV structure is formed in the via hole 130, metal grains constituting the first conductive layer 144 may be grown in an undesired manner. Accordingly, the metal grains may extrude to the outside of the via hole 130, thereby causing defects. However, according to the present embodiment, metal grains included in the first conductive plug 144P are sufficiently grown during the formation of the first conductive plug 144P before the formation of a TSV structure completes. Therefore, a subsequent process may be performed after the first conductive plug 144P is stabilized.

Figure 1G:
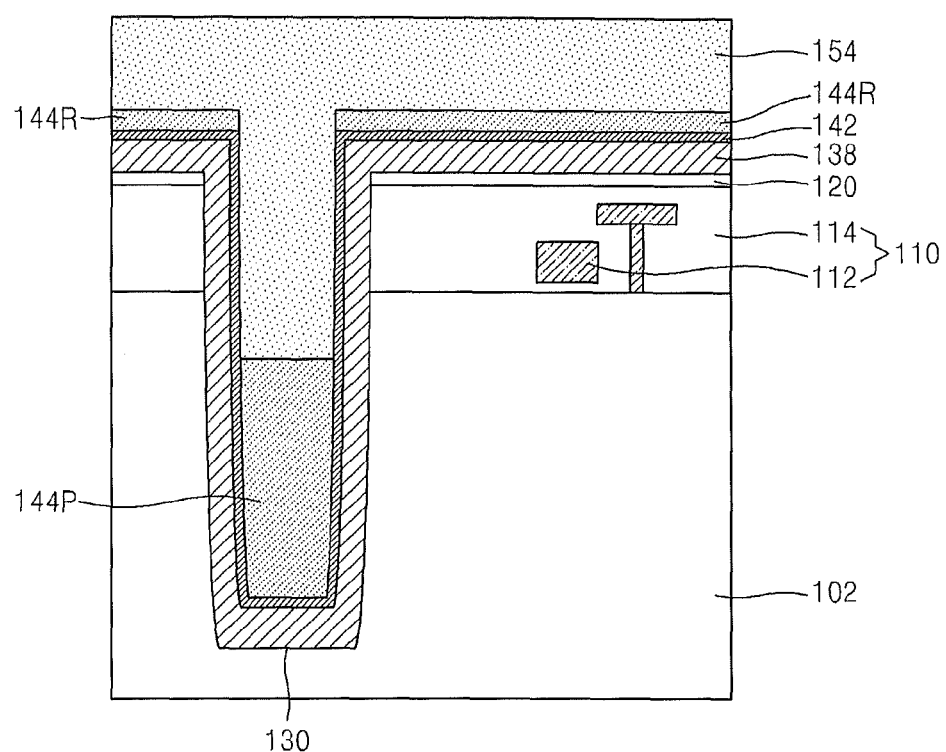

Referring to FIG. 1G, a second conductive layer 154 is formed in the via hole 130 and on the metal residual layer 144R to fill a remaining space over the first conductive plug 144P in the via hole 130.

The second conductive layer 154 includes a metal different from a metal constituting the first conductive plug 144P. For example, the second conductive layer 154 may include at least one metal selected from molybdenum (Mo), tantalum (Ta), or tungsten (W).

In some embodiments, the second conductive layer 154 may be formed by using PVD or electroplating.

Figure 1H:
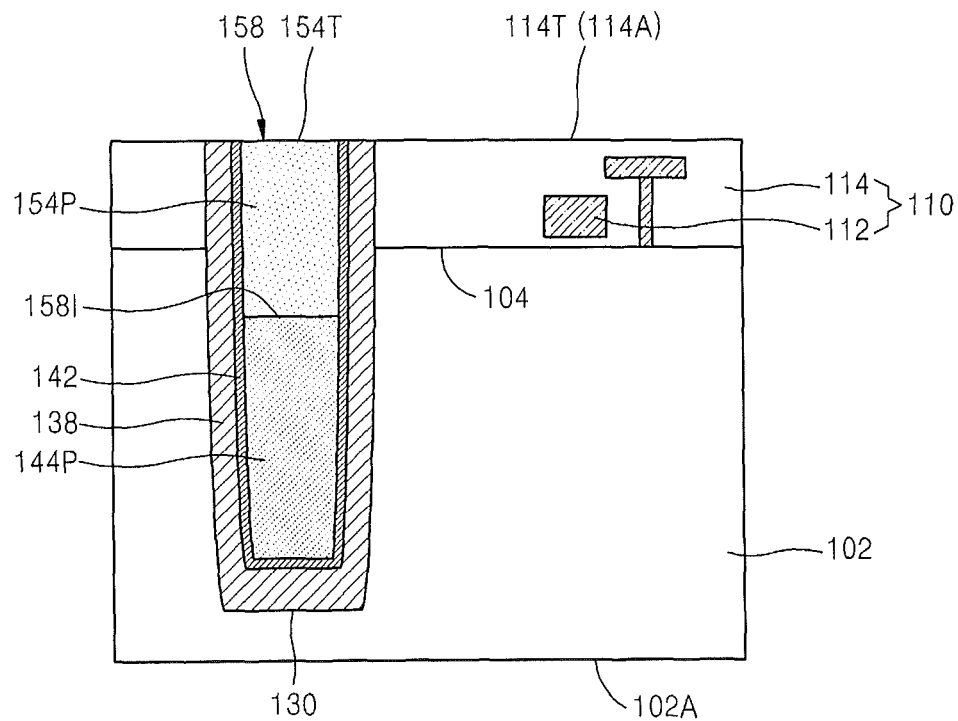

Referring to FIG. 1H, a second conductive plug 154P having a top surface 154T located at substantially the same level as that of the top surface 114T of the interlayer insulating film 114 is formed by polishing a resultant structure including the second conductive layer 154 by chemical mechanical polishing (CMP) by using the first polish-stop layer 120 as a stopper and removing the first polish-stop layer 120. If necessary, in order to remove the first polish-stop layer 120, an etch-back process may be performed.

The second conductive plug 154P has a bottom surface contacting the top surface 144T (see FIG. 1F) of the first conductive plug at a level lower than that of a top surface of the sub substrate 102. The second conductive plug 154P has the bottom surface that is located in the first hole 132 (see FIG. 1B) on the first through-electrode portion including the first conductive plug 144P, and extends to the same level as that of the top surface 114T of the interlayer insulating film 110. The second conductive plug 154P constitutes a second through-electrode portion.

In some embodiments, the second conductive plug 154P may be formed of a material having an adhesive force to the first barrier film 142 greater than that of the second conductive plug 154P. As such, since the second conductive plug 154P formed of a material having a greater adhesive force to the first barrier film 142 is formed in the via hole 130 close to the inlet of the via hole 130, the second conductive plug 154P can be prevented from being delaminated from the first barrier film 142 in the via hole 130 close the inlet of the via hole 130. Also, since the second conductive plug 154P limits displacement of the first conductive plug 144P in the via hole 130, deformation due to undesired growth of metal grains, for example, Cu grains, constituting the first conductive plug 144P and defects due to extrusion of the first conductive plug 144P from its position may be prevented.

The first barrier film 142, the first conductive plug 144P, and the second conductive plug 154P constitute a TSV structure 158. It will be understood that, as used herein, the term "TSV" includes any conductive via structure that extends through a substrate, regardless of whether the substrate comprises silicon.

FIG. 1H may also be regarded as illustrating an integrated circuit device according to other embodiments of the inventive concept that includes a substrate 102 and an insulating layer 114 on the substrate 102, to define a substrate outer face 102A, an insulating layer outer face 114A and a device interface 104 therebetween. A TSV structure 158 passes through the substrate 102 and the insulating layer 114: The TSV structure 158 comprises a first plug 144P that extends from adjacent the substrate outer face 102A towards the insulating layer outer face 114A, and a second plug 154P that extends from adjacent the insulating layer outer face 114A towards the substrate outer face 102A, to define a plug interface 1581 therebetween that is offset from the device interface 104. As used herein, "offset" means that the plug interface is at a different depth than the device interface 104, relative to the substrate outer face 102A and/or the insulating layer outer face 114A. The first and second plugs 144P and 154P may comprise different metals. The plug interface 1581 may be between the substrate outer face 102A and the device interface 104. A barrier layer 142 may be provided on side walls of the first and second plugs 144P and 154P, respectively.

Figure 1I:
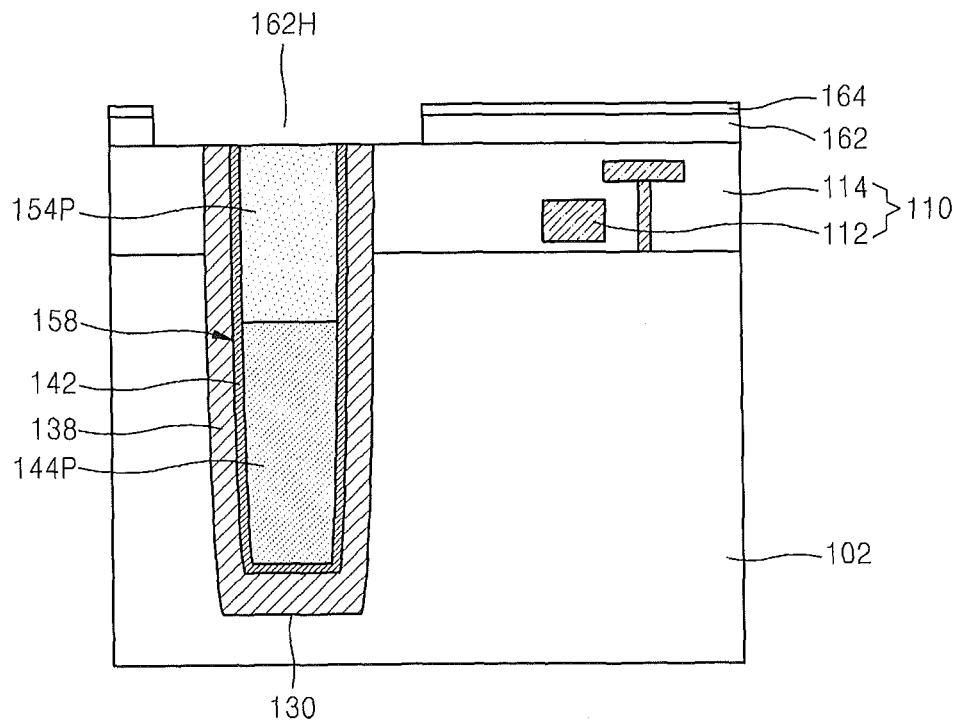

Referring to FIG. 1I, a metal wiring hole 162H through which the inlet of the via hole 130 and surroundings of the inlet of the via hole 130 are exposed is formed by sequentially forming an inter-metal insulating film 162 and a second polish-stop layer 164 on the interlayer insulating film 114 and patterning the inter-metal insulating film 162 and the second polish-stop layer 164. The inter-metal insulating film 162 may further include an etch-stop layer (not shown) directly formed on the interlayer insulating film 114. The etch-stop layer may be used as an etch stopper when the inter-metal insulating film 162 and the second polish-stop layer 164 are patterned to form the metal wiring hole 162H.

The second conductive plug 154P, the first barrier film 142 surrounding a side wall of the second conductive plug 154P, the insulating film 138 formed around the first barrier film 142, and the interlayer insulating film 114 are partially exposed through the metal wiring hole 162H. In some embodiments, the metal wiring hole 162H may be formed to expose only a top surface of the TSV structure 158 through the metal wiring hole 162H.

In some embodiments, the inter-metal insulating film 162 is formed of tetraethyl orthosilicate (TEOS), and the second polish-stop layer 164 is a silicon oxynitride film. Thicknesses of the inter-metal insulating film 162 and the second polish-stop layer 164 may be arbitrarily determined as desired.

Figure 1J:
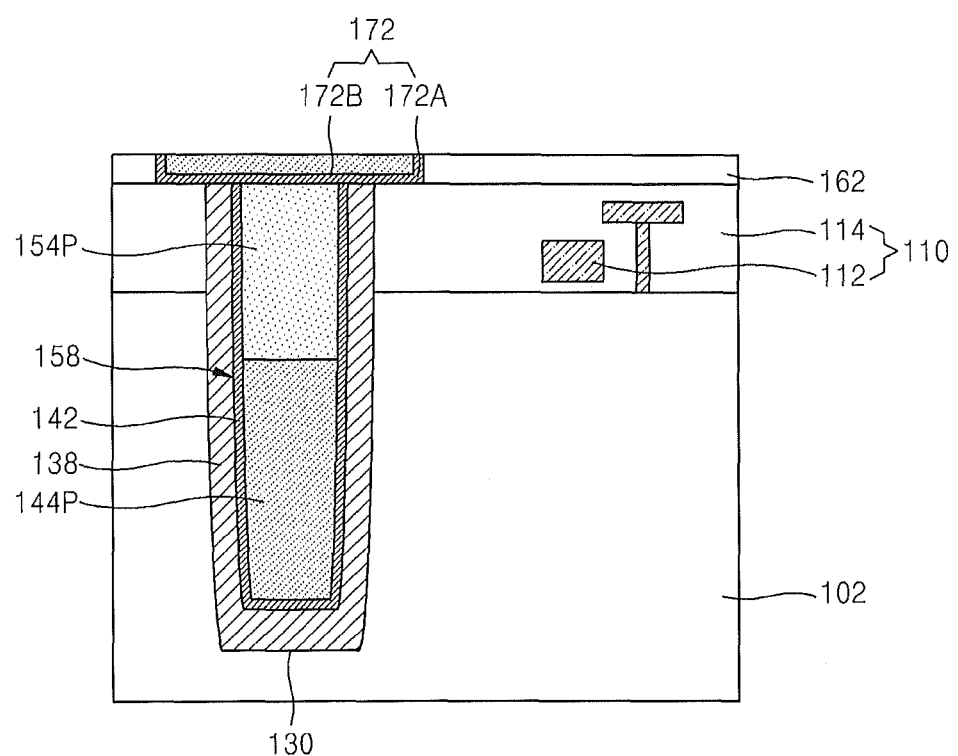

Referring to FIG. 1J, a metal wiring layer 172 is formed in the metal wiring hole 162H.

The metal wiring layer 172 has a structure in which a wiring barrier film 172A and a wiring metal layer 172B are sequentially stacked. In some embodiments, in order to form the metal wiring layer 172, after a first film for forming the wiring barrier film 172A and a second film for forming the wiring metal layer 172B are sequentially formed in the metal wiring hole 162H and on the second polish-stop layer 164, a top surface of the inter-metal insulating film 162 is exposed by polishing a resultant structure including the first film and the second film by CMP by using the second polish-stop layer 164 as a stopper and removing the second polish-stop layer 164. As a result, the wiring barrier film 172A and the wiring metal layer 172B are formed in the metal wiring hole 162H.

In some embodiments, the wiring barrier film 172A includes at least one material selected from Ti, TiN, Ta, or TaN. In some embodiments, in order to form the wiring barrier film 172A, PVD is used. The wiring barrier film 172A may be formed to have a thickness of about 1000 to 1500 Å.

In some embodiments, the wiring metal layer 172B is formed of Cu. In this case, in order to form the wiring metal layer 172B, in a similar manner to that of a process of forming the first conductive layer 144 described with reference to FIG. 1E, after a Cu seed layer may be formed by using PVD on a surface of the wiring barrier film 172A, a Cu layer may be formed by using electroplating on the Cu seed layer, and a resultant structure including the Cu seed layer and the Cu layer may be annealed.

Figure 1K:
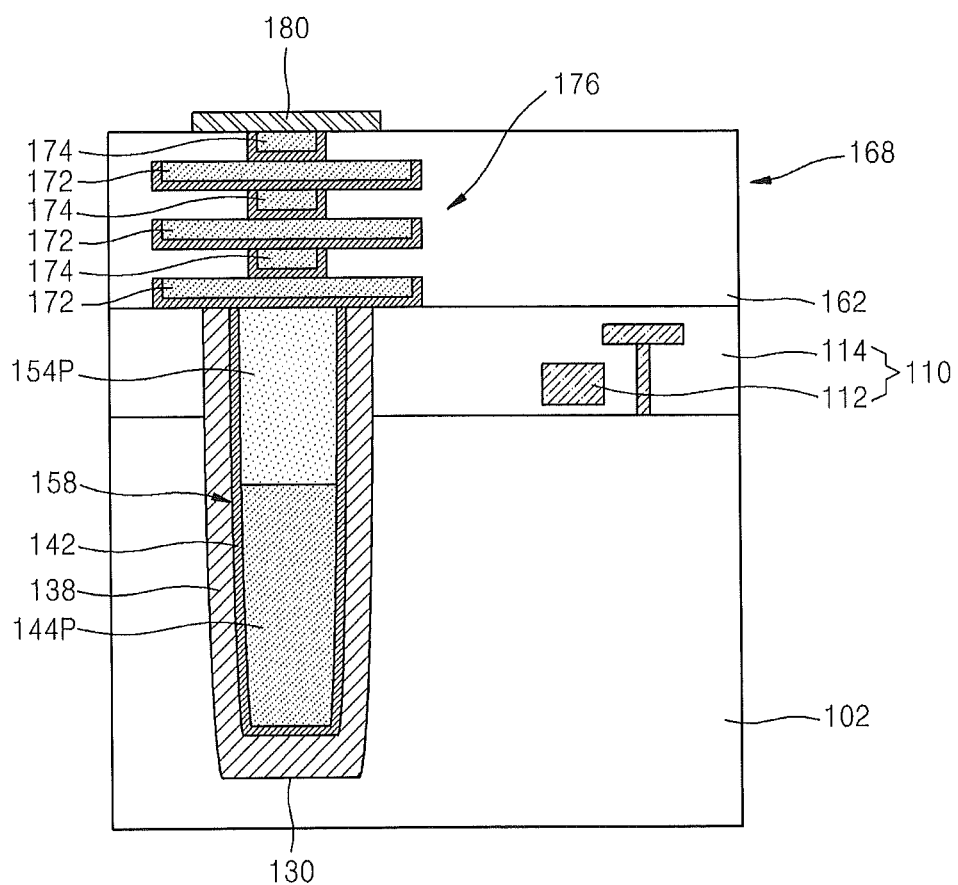

Referring to FIG. 1K, by using a process similar to a process of forming the metal wiring layer 172 described with reference to FIGS. 1I and 1J, a contact plug 174 having the same stack structure as that of the metal wiring layer 172 is formed on the metal wiring layer 172. Next, by repeatedly performing a process of forming the metal wiring layer 172 described with reference to FIGS. 1I and 1J and a process of forming the contact plug 174, a multi-layer wiring pattern 176 for through-electrode to which a plurality of the metal wiring layers 172 and a plurality of the contact plugs 174 are alternately connected is formed.

In some embodiments, when the multi-layer wiring pattern 176 is formed, other multi-layer wiring patterns each including a metal wiring layer and a contact plug which are formed at the same time as at least some of the plurality of metal wiring layers 172 and the plurality of contact plugs 174 are formed are formed on other portions on the substrate 102. As a result, a back-end-of-line (BEOL) structure 168 including the inter-metal insulating film 162 and a plurality of multi-layer wiring patterns including portions insulated by the inter-metal insulating film 162 is formed on the FEOL structure 110. The BEOL structure 168 may be formed to include a plurality of wiring structures for connecting the individual devices 112 included in the FEOL structure 110 to other wirings formed on the substrate 102. In some embodiments, the BEOL structure 168 may be formed to further include a seal ring for protecting the wiring structures and other structures under the wiring structures from external impact or moisture.

Next, a contact pad 180 electrically connected to the multi-layer wiring pattern 176 is formed on the inter-metal insulating film 162.

The inter-metal insulating film 162 isolates the plurality of metal wiring layers 172. The plurality of metal wiring layers 172 and the plurality of contact plugs 174 may be electrically isolated from adjacent wirings at the same level due to the inter-metal insulating film 162.

Although the multi-layer wiring pattern 176 includes three metal wiring layers 172 and three contact plugs 174 in FIG. 1K for convenience of explanation, the present embodiment is not limited thereto. Also, a connection structure between the metal wiring layers 172 and the contact plugs 174 of the multi-layer wiring pattern 176 of FIG. 1K is exemplarily illustrated and the present embodiment is not limited to the specific connection structure illustrated in FIG. 1K.

In some embodiments, each of the plurality of metal wiring layers 172 and the plurality of contact plugs 174 may include at least one metal selected from tungsten (W), aluminium (Al), or copper (Cu). In some embodiments, the plurality of metal wiring layers 172 and the plurality of contact plugs 174 may be formed of the same material. In another embodiment, at least some of the plurality of metal wiring layers 172 and the plurality of contact plugs 174 may include different materials.

In some embodiments, other multi-layer wiring patterns (not shown) are formed at the same level as that of the multi-layer wiring pattern 176 in the inter-metal insulating film 162. Also, other contact pads (not shown) are formed at the same level as that of the contact pad 180 on the inter-metal insulating film 162.

Figure 1L:
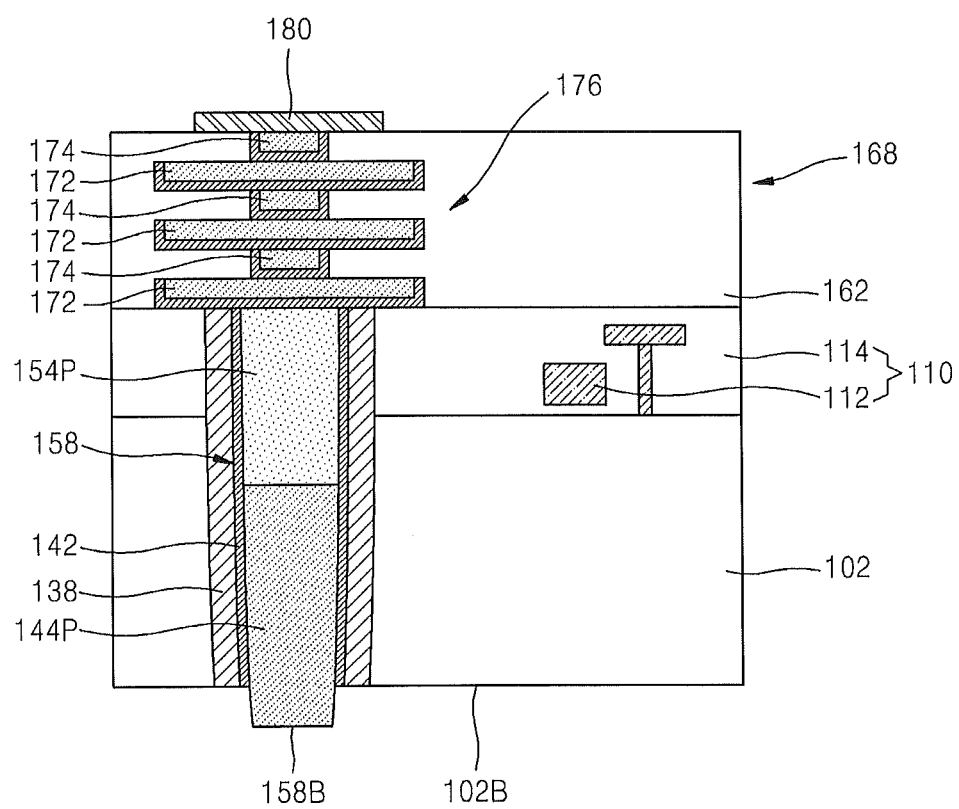

Referring to FIG. 1L, a bottom surface 158B of the TSV structure 158 is exposed by partially removing the substrate 102 from a bottom surface 102B of the substrate 102.

As shown in FIG. 1L, the substrate 102 may be partially removed such that the bottom surface 158B of the TSV structure 158 extrudes from the bottom surface 102B of the substrate 102. In some embodiments, in order to partially remove the substrate 102 from the bottom surface 102B of the substrate 102, CMP, etch-back, or a combination thereof may be used.

As the substrate 102 is partially removed from the bottom surface 102B of the substrate 102, the via hole 130 including the first hole 132 and the second hole 134 becomes a through-hole passing through the substrate 102 and the interlayer insulating film 114.

After the bottom surface 158B of the TSV structure 158 is exposed, a portion of the insulating film 138 surrounding the TSV structure 158 around the extruding portion of the TSV structure 158 is removed by using isotropic etching or anisotropic etching. Next, a side wall of the first conductive plug 144P is exposed at the extruding portion of the TSV structure 158 by removing a portion of the first barrier film 142 exposed when the insulating film 138 is removed.

Figure 1M:
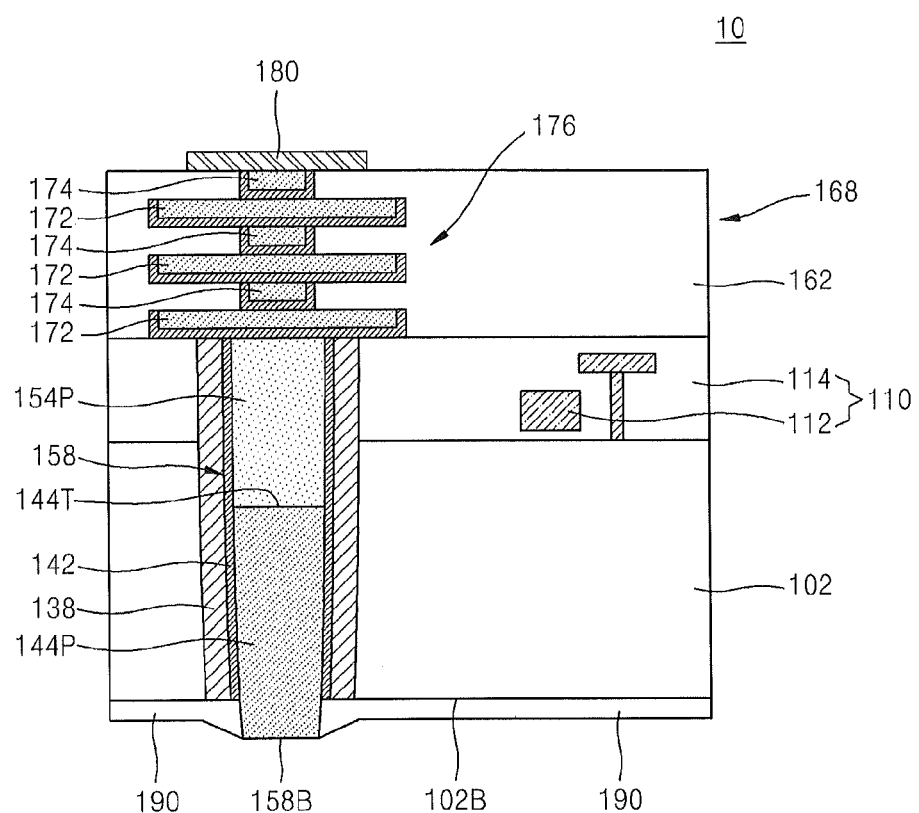

Referring to FIG. 1M, the integrated circuit device 10 is formed by forming a back side insulating film 190 that covers the bottom surface 102B of the substrate 102 that is partially removed around the TSV structure 158.

In some embodiments, the back side insulating film 190 may be formed by using spin coating or spraying. The back side insulating film 190 may be formed of polymer. In some embodiments, in order to form the back side insulating film 190, after a polymer film that covers the bottom surface 102B of the substrate 102 and the TSV structure 158 is formed, the TSV structure 158 may be exposed by partially etching back the polymer film.

In the integrated circuit device 10, the TSV structure 158 includes a first through-electrode portion including the first conductive plug 144P that has the top surface 144T located in the first hole 132 (see FIG. 1B) and the side wall surrounded by the first barrier film 142, and the second through-electrode portion including the second conductive plug 154P that has the side wall surrounded by the first barrier film 142 and extends from a top surface of the first through-electrode portion including the first conductive plug 144P to the second hole 134 (see FIG. 1B). The first conductive plug 144P and the second conductive plug 154P may include different metals. When the TSV structure 158 is formed, since metal grains constituting the first conductive plug 144P are sufficiently grown and then the second conductive plug 154P is formed on the first conductive plug 144P, defects due to extrusion of the TSV structure 158 caused by undesired growth of the metal grains may be avoided.

Figure 2:
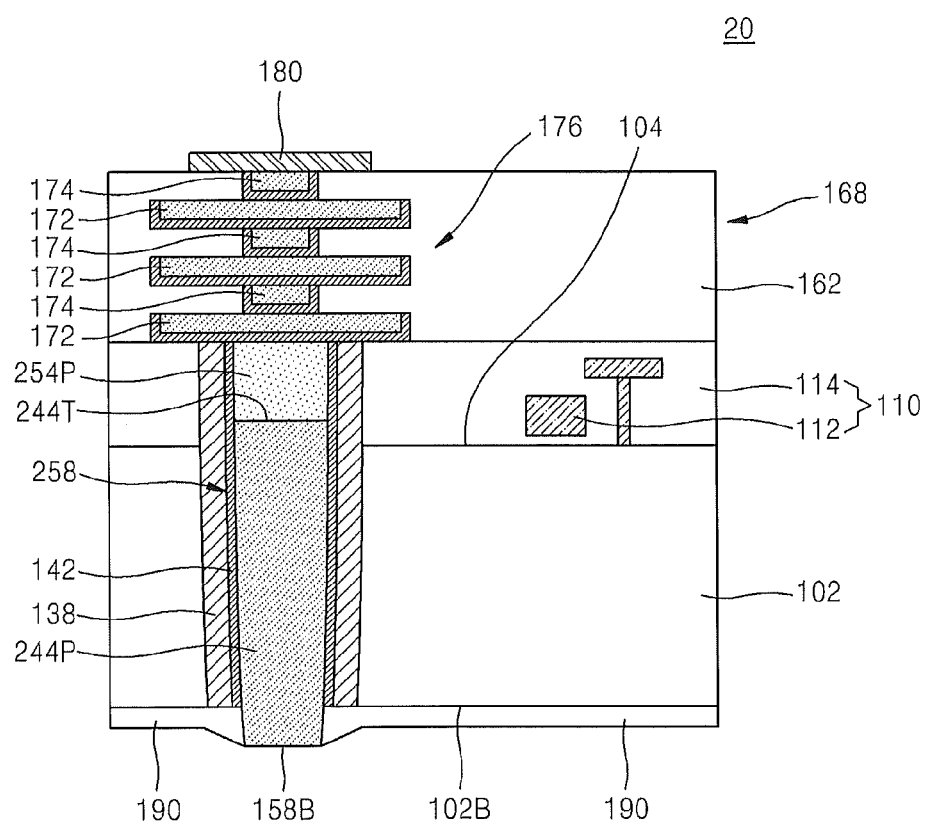
FIG. 2 is a cross-sectional view illustrating an integrated circuit device according to other embodiments of the inventive concept.

FIG. 2 is a cross-sectional view illustrating an integrated circuit device 20 according to another embodiment of the inventive concept. In FIG. 2, the same members as those in FIGS. 1A through 1M are denoted by the same reference numerals, and thus in order to avoid repeated explanation, a detailed explanation thereof will not be given.

Referring to FIG. 2, the integrated circuit device 20 has the same structure as the integrated circuit device 10 of FIG. 1M except that a TSV structure 258 includes a first conductive plug 244P having a top surface 244T located at a level higher than a level of the interface 104 between the substrate 102 and the interlayer insulating film 114, and a second conductive plug 254P formed on the first conductive plug 244P.

The first conductive plug 244P and the second conductive plug 254P may be subjected to a process similar to that described with reference to FIGS. 1E through 1H. However, in order for a level of the top surface 244T of the first conductive plug 244P to be higher than a level of the interface 104, a thickness of the first conductive layer 144 may be greater than that in FIG. 1E.

FIGS. 3A through 3E are cross-sectional views illustrating a method of manufacturing an integrated circuit device 30 and the integrated circuit device 30 so manufactured (see FIG. 3E), according to another embodiment of the inventive concept. In FIGS. 3A through 3E, the same members as those in FIGS. 1A through 1M and 2A through 2E are denoted by the same reference numerals, and thus in order to avoid repeated explanation, a detailed explanation thereof will not be given.

Figure 3A:
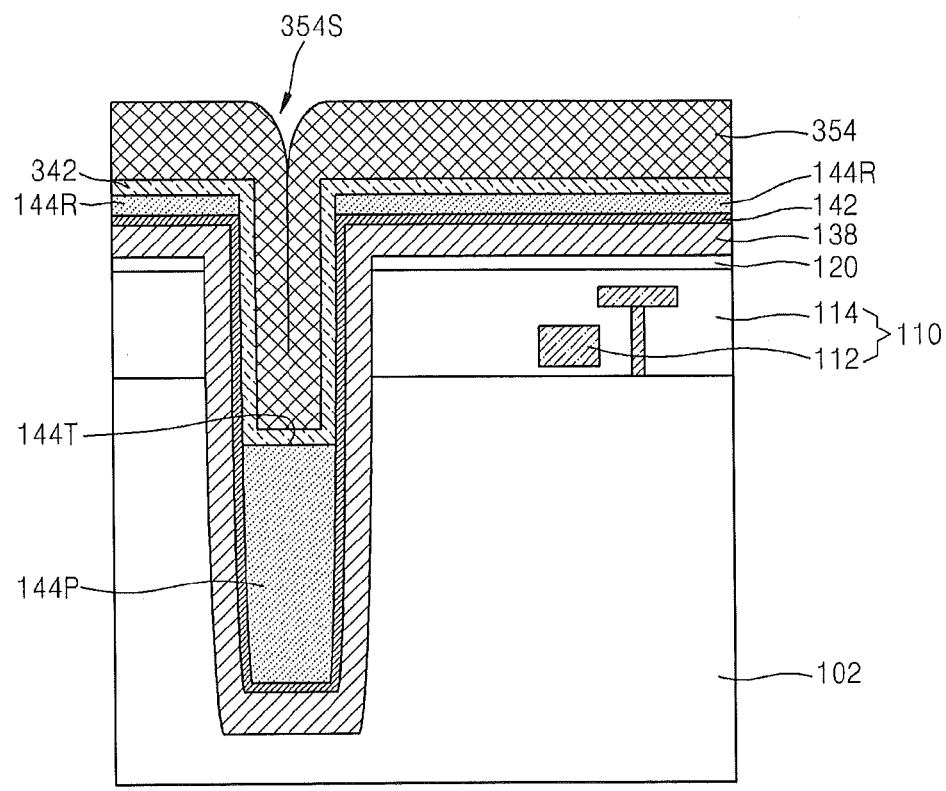
FIGS. 3A through 3E are cross-sectional views illustrating a method of manufacturing an integrated circuit device and an integrated circuit device so manufactured, according to other embodiments of the inventive concept.

Referring to FIG. 3A, by using a set of processes similar to those described with reference to FIGS. 1A through 1F, after the first conductive plug 144P is formed in the via hole 130, a second barrier film 342 is formed on the top surface 144T of the first conductive plug 144P in the via hole 130, an exposed surface of the first barrier film 142, and an exposed surface of the metal residual layer 144R. Next, by using a process similar to a process of forming the second conductive layer 254 described with reference to FIG. 2A, a second conductive layer 354 is formed on the second barrier film 342 to fill a remaining space on the second barrier film 342 in the via hole 130.

In some embodiments, in order to form the second barrier film 342, a PVD process is performed. The second barrier film 342 may be formed to have a thickness of about 1000 to 1500 Å. In some embodiments, the second barrier film 342 is formed of tungsten nitride (WN).

In order to form the second conductive layer 354, a CVD process is performed. As the second conductive layer 354 is formed by performing a CVD process, a seam 354S is formed on a surface of the second conductive layer 354 on the via hole 130. The seam 354S may be deeply formed into the via hole 130 from the surface of the second conductive layer 354. In some embodiments, the second conductive layer 354 is formed of tungsten (W).

Figure 3B:
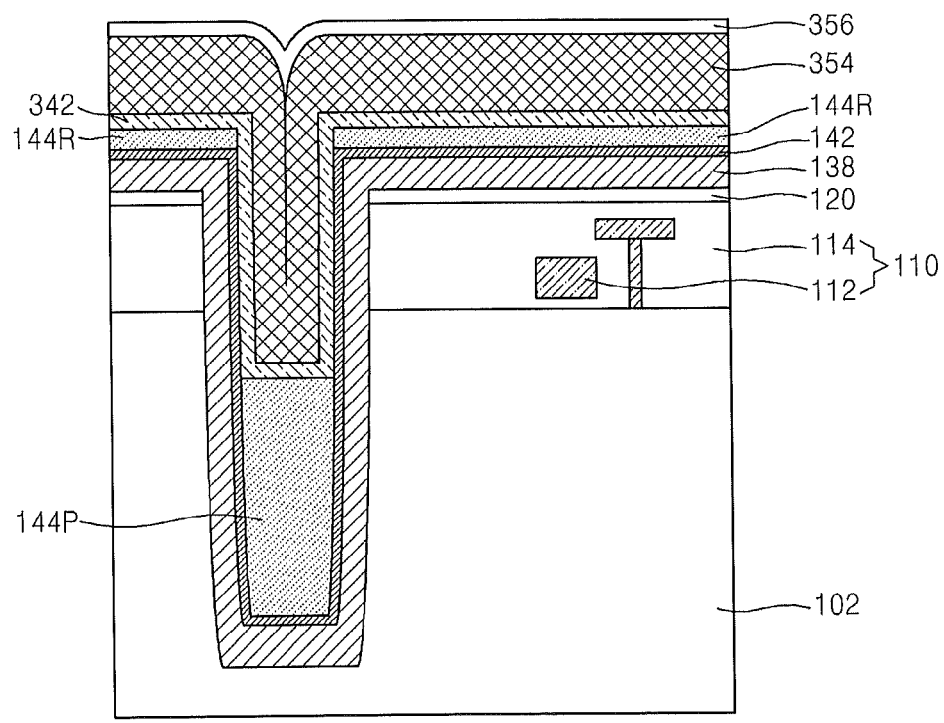

Referring to FIG. 3B, a grain growth accelerating layer 356 is formed on the second conductive layer 354 in which the seam 354S (see FIG. 3A) is formed.

When the second conductive layer 354 is annealed in order to remove the seam 354S in a subsequent process described with reference to FIG. 3C, the grain growth accelerating layer 356 may reduce grain boundary energy between metal gains constituting the second conductive layer 354 and may accelerate growth of the metal grains. In some embodiments, the grain growth accelerating layer 356 includes a metal different from metals constituting the first conductive plug 144P and the second, conductive player 354. In some embodiments, the grain growth accelerating layer 356 includes nickel (Ni). In some embodiments, the grain growth accelerating layer 356 is formed to a thickness of about 1000 to 1500 Å.

Figure 3C:
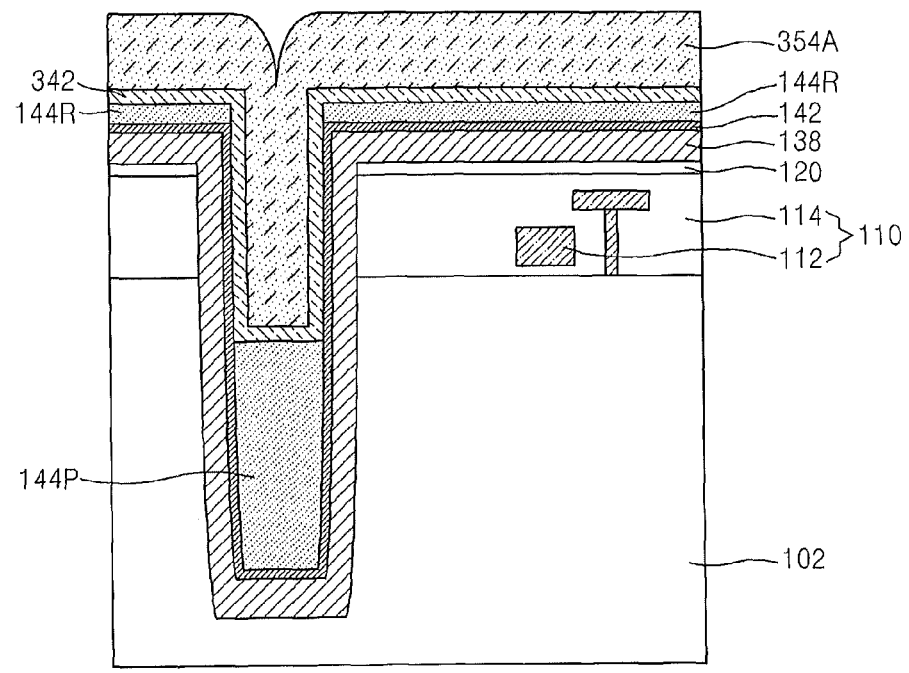

Referring to FIG. 3C, an annealed second conductive layer 354A is formed by annealing a resultant structure including the second conductive layer 354 and the grain growth accelerating layer 356, and removing at least a portion of the seam 354S formed on the surface of the second conductive layer 354.

The annealing may be performed at a temperature of about 300 to 500° C. In some embodiments, while the resultant structure including the second conductive layer 354 and the grain growth accelerating layer 356 is annealed, a metal, for example, Ni, constituting the grain growth accelerating layer 356 is diffused into the second conductive layer 354 up to a grain boundary of the second conductive layer 354. The metal diffused to the grain boundary reduces grain boundary energy and accelerates growth of grains. As such, as metal grains constituting the second conductive layer 354 are grown and sizes of the metal grains increase, the seam 354S formed on the surface of the second conductive layer 354 may be mostly removed. As shown in FIG. 3C, a small concave portion may remain on a surface of the second conductive layer 354A. Also, as a metal, for example, Ni, constituting the grain growth accelerating layer 356 is diffused within the second conductive layer 354 during the annealing, metal elements, for example, Ni elements are remained within the annealed second conductive layer 354A.

Figure 3D:
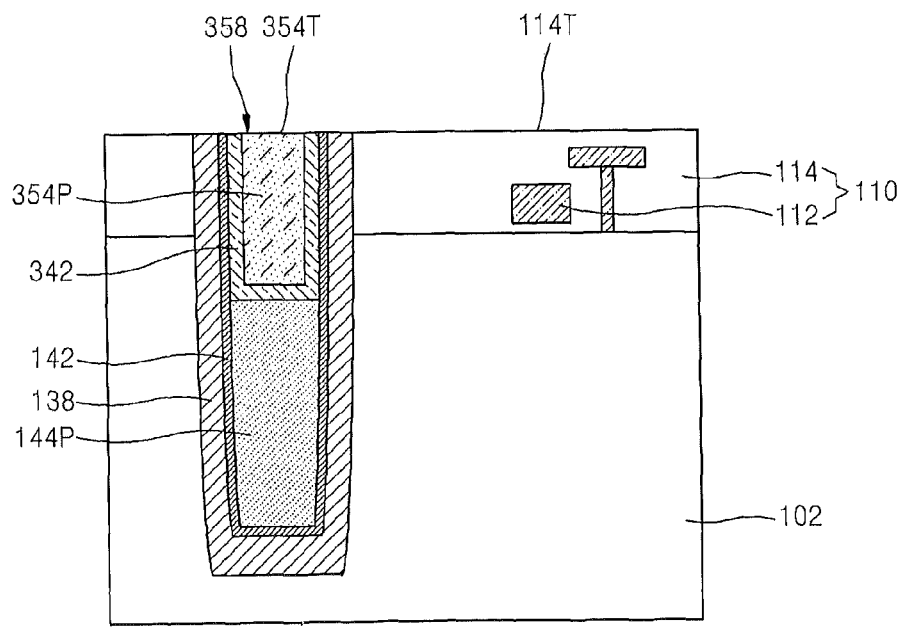

Referring to FIG. 3D, by using a method similar to that described with reference to FIG. 1H, a resultant structure including the annealed second conductive layer 354A is polished by performing a CMP process until the top surface 114T of the interlayer insulating film 114 is exposed, and a second conductive plug 354P having a top surface 354T located at substantially the same level as that of the top surface 114T of the interlayer insulating film 114 is formed.

The first barrier film 142, the first conductive plug 144P, the second barrier film 342, and the second conductive plug 354P constitute a TSV structure 358.

Figure 3E:
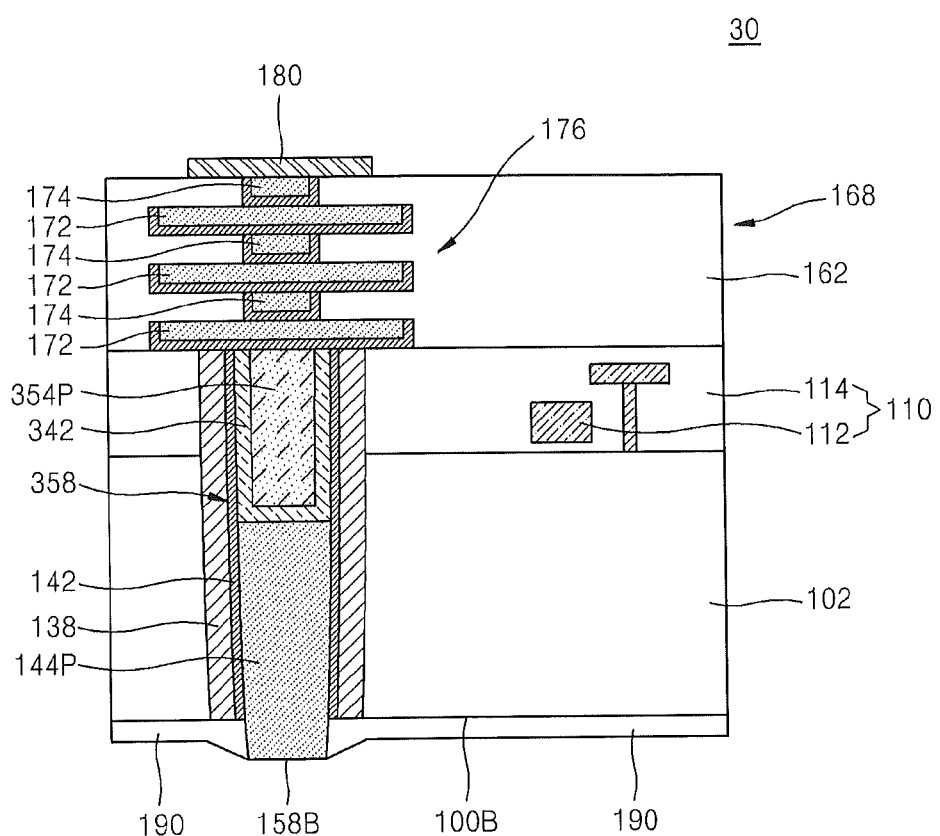

Referring to FIG. 3E, by performing processes similar to those described with reference to FIGS. 1I through 1M, the integrated circuit device 30 is completely formed.

In the integrated circuit device 30, the TSV structure 358 includes a first through-electrode portion including the first conductive plug 144P having the top surface 144T located in the first hole 132 (see FIG. 1B) and the side wall surrounded by the first barrier film 142, and a second through-electrode portion including the second conductive plug 354P having a side wall surrounded by the first barrier film 142 and extending from a top surface of the first through-electrode portion including the first conductive plug 144P to the second hole (see FIG. 1B). The second through-electrode portion further includes the second barrier film 342 that surrounds at least a portion of the second conductive plug 354P. The second barrier film 342 contacts the top surface 144T of the first conductive plug 144P and the first barrier film 142. The first conductive plug 144P and the second conductive plug 354P include different metals. When the TSV structure 358 is formed, since metal grains constituting the first conductive plug 144P are sufficiently grown and then the second conductive plug 354P is formed on the first conductive plug 144P, defects due to extrusion of the TSV structure 358 caused by undesired growth of the metal grains may be avoided.

FIGS. 4A through 4D are cross-sectional views illustrating a method of manufacturing an integrated circuit device 40 and the integrated circuit device 40 so manufactured (see FIG. 4D), according to another embodiment of the inventive concept. In FIGS. 4A through 4D, the same members as those in FIGS. 1A through 1M are denoted by the same reference numerals, and thus in order to avoid repeated explanation, a detailed explanation thereof will not be given.

Figure 4A:
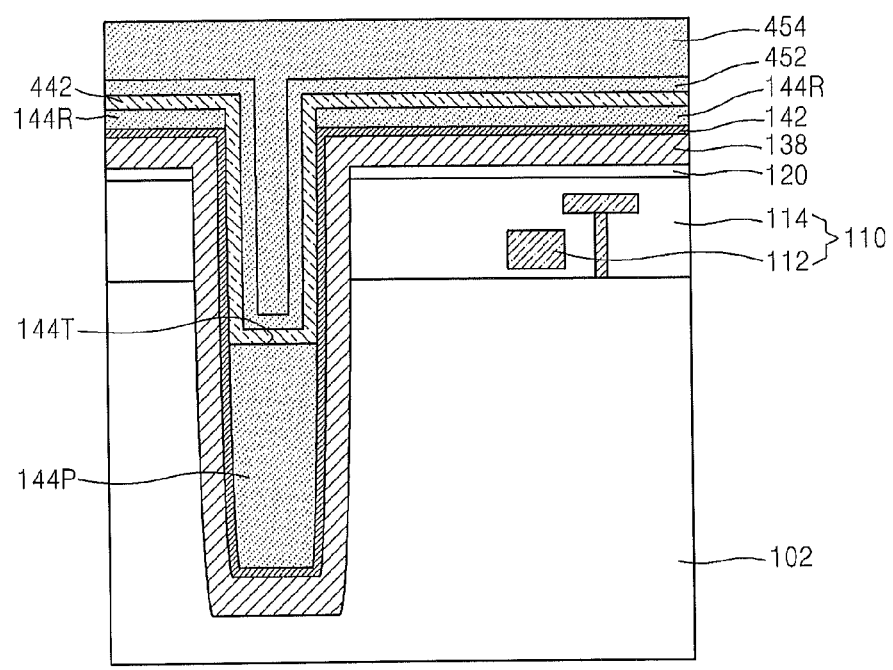
FIGS. 4A through 4D are cross-sectional views illustrating a method of manufacturing an integrated circuit device and an integrated circuit device so manufactured, according to other embodiments of the inventive concept.

Referring to FIG. 4A, by using a set of processes similar to those described with reference to FIGS. 1A through 1F, after the first conductive plug 144P is formed in the via hole 130, a second barrier film 442 is formed on the top surface 144T of the first conductive plug 144P in the via hole 130, an exposed surface of the first barrier film 142, and an exposed surface of the metal residual layer 144R. Next, a metal seed layer 452 and a second conductive layer 454 are sequentially formed on the second barrier film 442. The second conductive layer 454 is formed to have an enough thickness to fill a remaining space of the via hole 130.

In some embodiments, the second barrier film 442 includes at least one material selected from Ti, TiN, Ta, or TaN. In another embodiment, the second barrier film 442 may not be formed, and the metal seed layer 452 may be directly formed on the first conductive plug 144P.

In some embodiments, each of the metal seed layer 452 and the second conductive layer 454 includes Cu. In order to form the metal seed layer 452, a PVD process may be performed. In order to form the second conductive layer 454, electroplating may be performed.

When the metal seed layer 452 is formed by performing a PVD process, a depth of an inner space of the via hole 130 in which the metal seed layer 452 is formed is not deeper than a depth of a bottom surface of the via hole 130. Accordingly, a surface roughness of the metal seed layer 452 at a portion of an inner wall close to the inlet of the via hole 130 is less than that in a process described with reference to FIG. 1E. Accordingly, an additional process of improving the surface roughness of the metal seed layer 452 is not required.

Figure 4B:
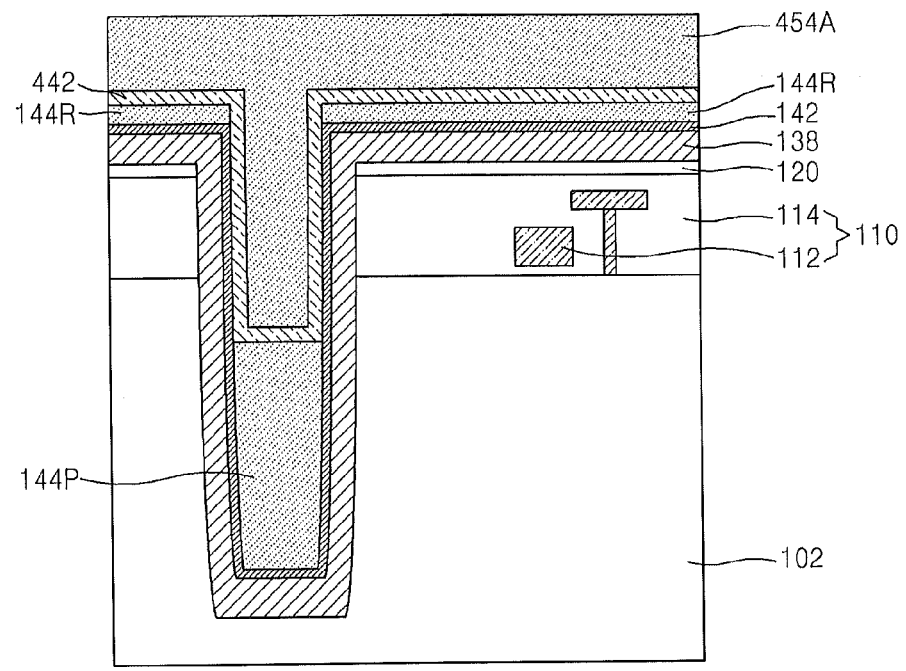

Referring to FIG. 4B, a reflow second conductive layer 454A is formed from the metal seed layer 452 and the second conductive layer 454 by performing a reflow process on a resultant structure including the metal seed layer 452 and the second conductive layer 454.

In some embodiments, the reflow process may be performed for about 10 to 20 minutes at a temperature of about 300 to 500°. Due to the reflow process, metal grains, for example, Cu grains, in the second conductive layer 454, may be sufficiently grown. Accordingly, after a TSV structure 458 is formed in the via hole 130, defects caused by deformation of the TSV structure 458 such as extrusion of the metal grains to the outside of the via hole 130 caused by growth of the metal grains may be avoided.

Figure 4C:
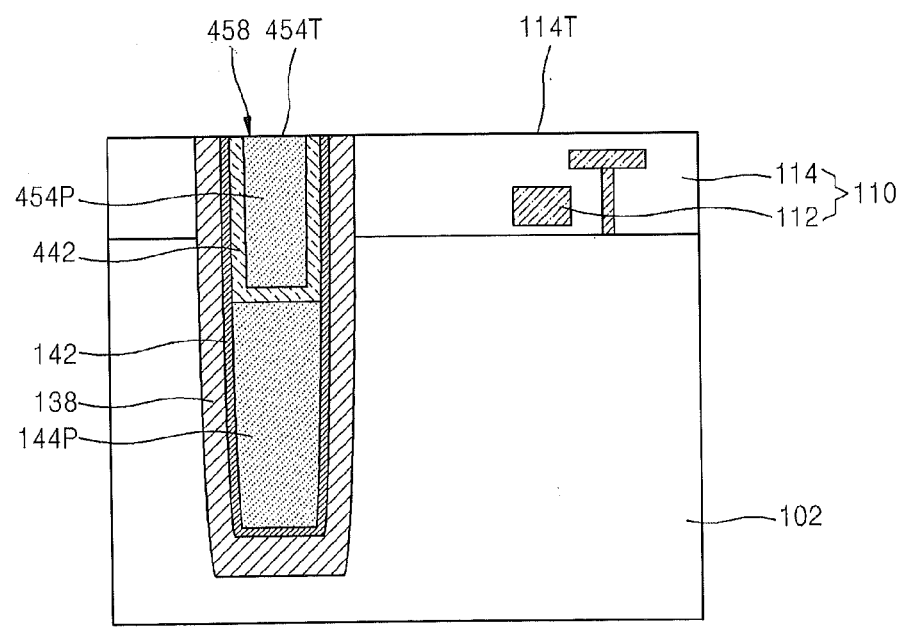

Referring to FIG. 4C, a resultant structure including the reflow second conductive layer 454A is polished by performing a CMP process until the top surface 114T of the interlayer insulating film 114 is exposed, and a second conductive plug 454P having a top surface 454T located at substantially the same level as that of the top surface 114T of the interlayer insulating film 114 is formed.

The first barrier film 142, the first conductive plug 144P, the second barrier film 442, and the second conductive plug 454P constitute the TSV structure 458.

Figure 4D:
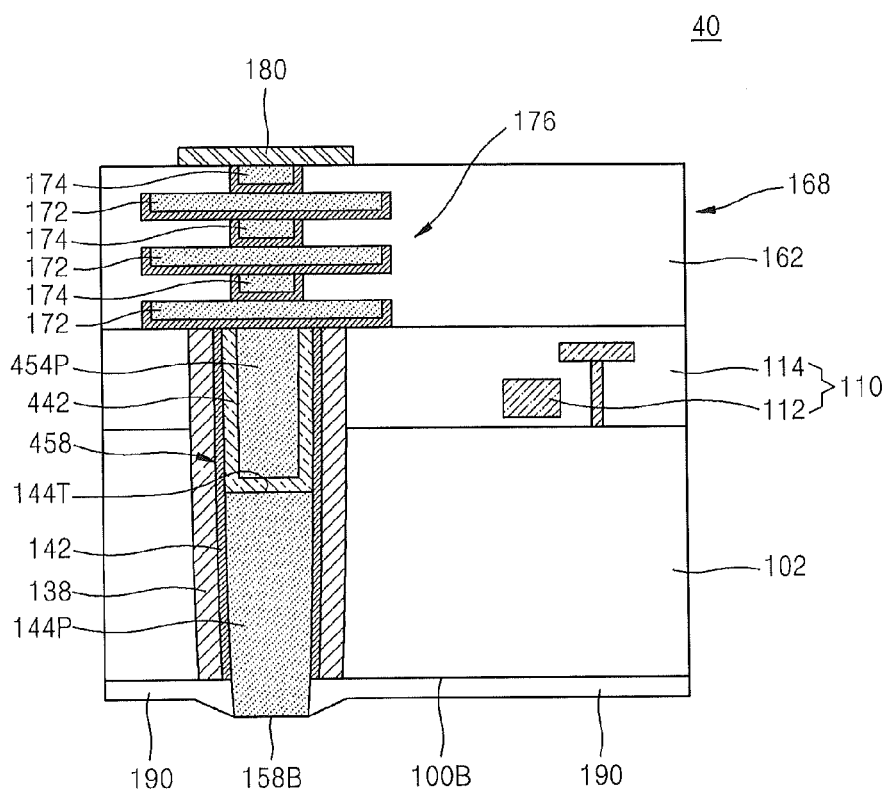

Referring to FIG. 4D, by performing processes similar to those described with reference to FIGS. 1I through 1M, the integrated circuit device 40 is formed.

In the integrated circuit device 40, the TSV structure 458 includes a first through-electrode portion including the first conductive plug 144P having the top surface 144T located in the first hole 132 (see FIG. 1B) and the side wall surrounded by the first barrier film 142, and a second through-electrode portion including the second conductive plug 454P having a side wall surrounded by the first barrier film 142 and extending from a top surface of the first through-electrode portion including the first conductive plug 144P to the second hole 134 (See FIG. 1B), The second through-electrode portion further includes the second barrier film 442 surrounding at least a portion of the second conductive plug 454P. The second barrier film 442 contacts the top surface 144T of the first conductive plug 144P and contacts the first barrier film 142. The first conductive plug 144P and the second conductive plug 454P include the same metal. The second barrier film 442 may include a metal having an adhesive force to the first barrier film 142 greater than that of a metal constituting the first conductive plug 144P. Accordingly, different films of the TSV structure 458 may be prevented from being delaminated therebetween. Also, when the TSV structure 458 is formed, since metal grains constituting the first conductive plug 144P are sufficiently grown and then the second conductive plug 454P is formed on the first conductive plug 144P, defects due to extrusion of the TSV structure 458 caused by undesired growth of the metal grains may be avoided.

FIGS. 5A through 5H are cross-sectional views illustrating a method of manufacturing an integrated circuit device 50 and the integrated circuit device 50 so manufactured (see FIG. 5H), according to another embodiment of the inventive concept. In FIGS. 5A through 5H, the same members as those in FIGS. 1A through 1M are denoted by the same reference numerals, and thus in order to avoid repeated explanation, a detailed explanation thereof will not be given.

Figure 5A:
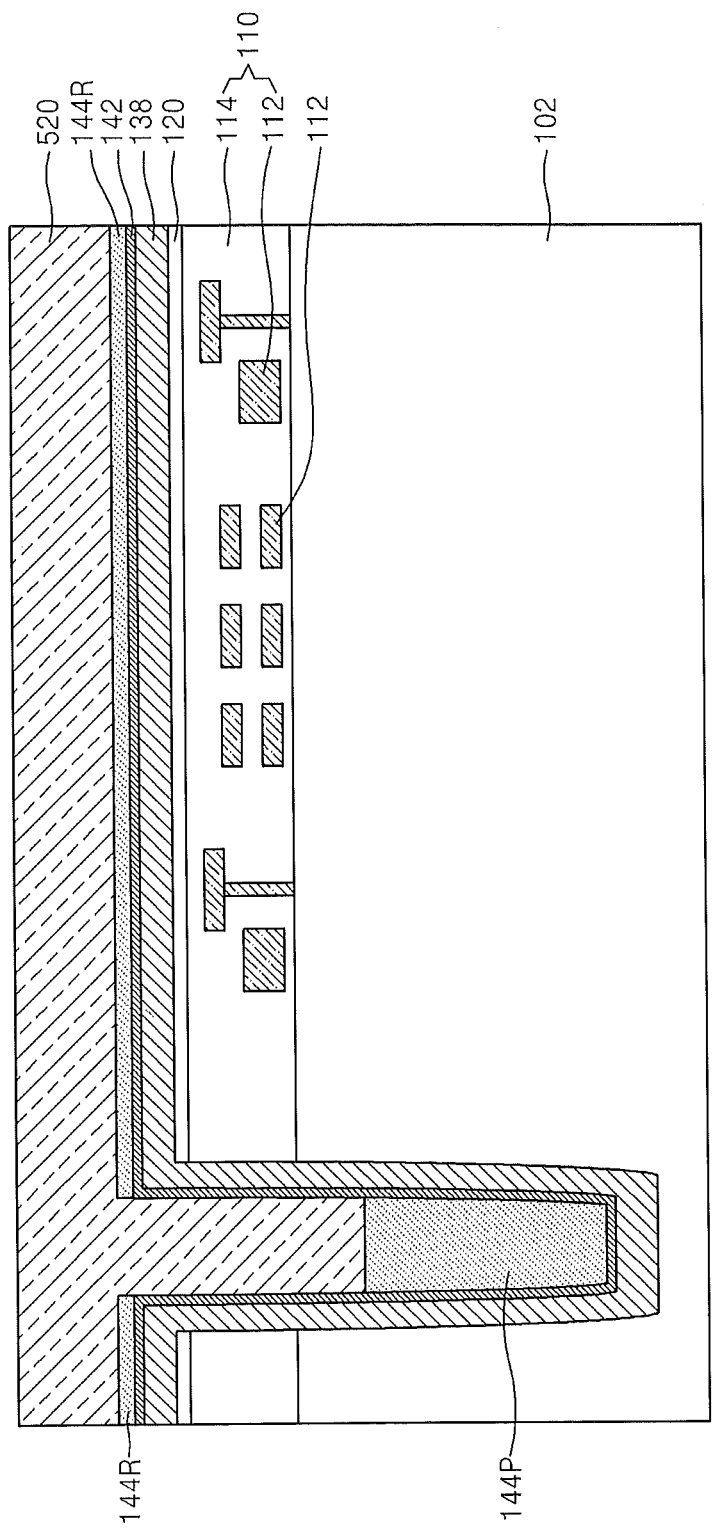
FIGS. 5A through 5H are cross-sectional views illustrating a method of manufacturing an integrated circuit device and an integrated circuit device so manufactured, according to other embodiments of the inventive concept.

Referring to FIG. 5A, by using a set of processes similar to those described with reference to FIGS. 1A through 1F, after the first conductive plug 144P is formed in the via hole 130, the via hole 130 is filled with a protective film 520.

The protective film 520 is formed of a material having an etch selectivity with respective to each of the first insulating film 138 and the first barrier film 142.

In some embodiments, the protective film 520 is formed of a material having an etch selectivity with respect to each of an oxide film, an oxynitride film, and a nitride film that may be formed on the substrate 102 in a subsequent process. For example, the protective layer 520 may be formed of at least one material selected from tonen silazene (TOSZ), silicon doped with impurities, or silicon germanium doped with impurities.

When the protective film 520 is formed, in order to form the protective film 520 to have an enough thickness to fill the via hole 130, the protective film 520 is formed not only in the via hole 130 but also on a top surface of the metal residual layer 144R.

Figure 5B:
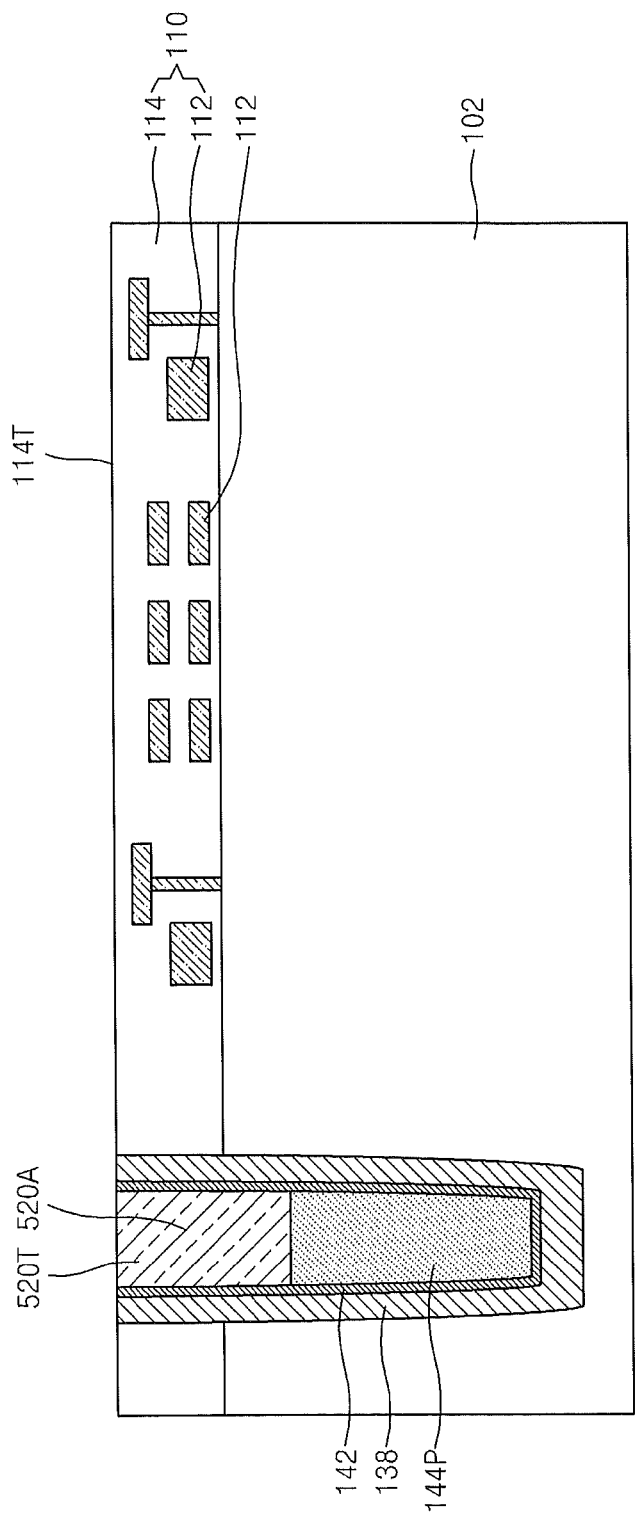

Referring to FIG. 5B, in order to remain the protective layer 520 only in the via hole 130, the protective film 520, the metal residual layer 144R, the first barrier film 142, and the insulating film 138 are removed on the substrate 102 by performing a CMP process by using the first polish-stop layer 120 as a polishing stopper. Next, the first polish-stop layer 120 is removed to expose the top surface 114T of the interlayer insulating film 114 and to remain a protective film pattern 520A within the via hole 130. The protective film pattern 520A has a top surface 520T located at substantially the same level as that of the top surface 114T of the interlayer insulating film 114.

Figure 5C:
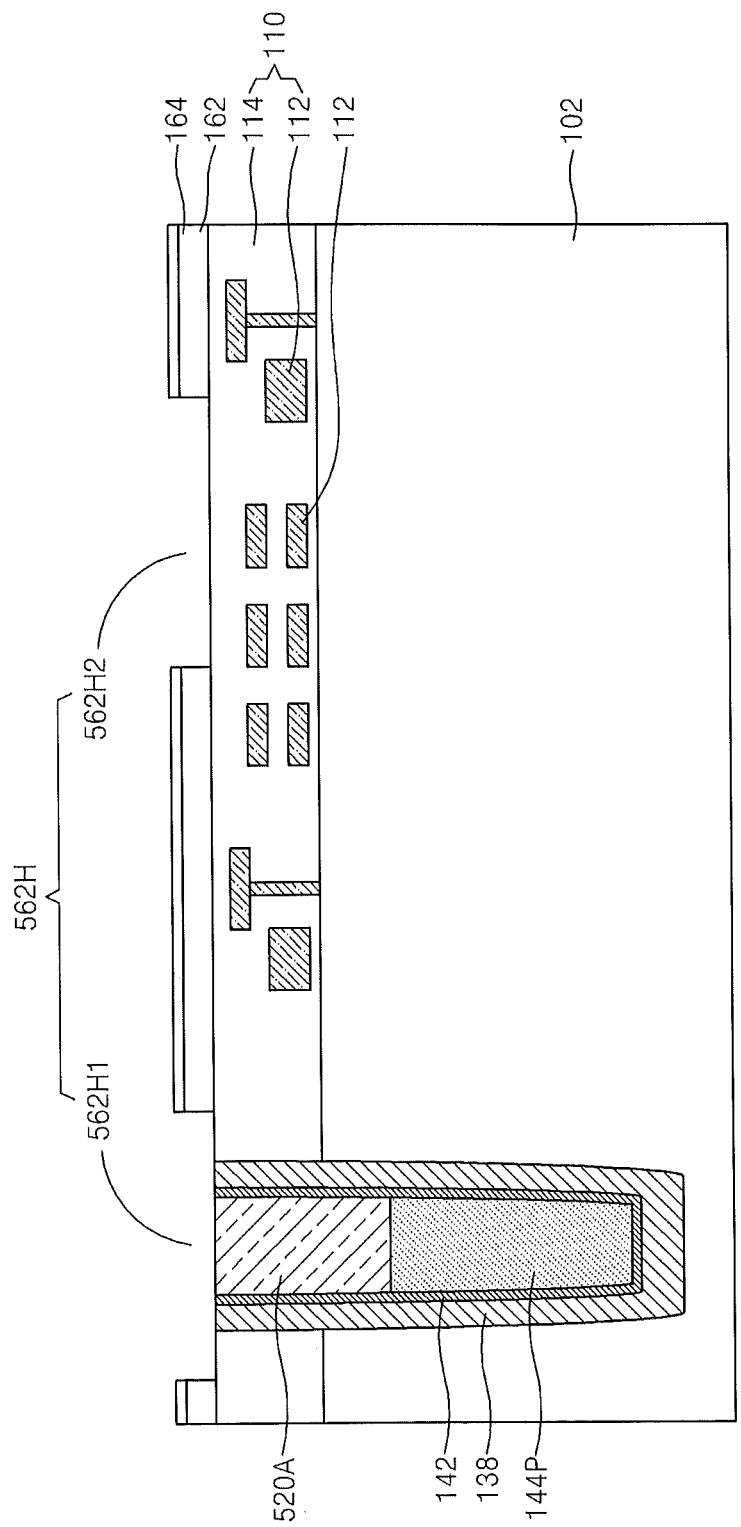

Referring to FIG. 5C, by using a method similar to that described with reference to FIG. 1I, a plurality of wiring holes 562H are formed by sequentially forming the inter-metal insulating film 162 and the second polish-stop layer 164 on the interlayer insulating film 114 and the protective film 520 and patterning the inter-metal insulating film 162 and the second polish-stop layer 164. The inter-metal insulating film 162 may further include an etch-stop layer (not shown) directly formed on the interlayer insulating film 114. The etch-stop layer may be used as an etch stopper when the inter-metal insulating film 162 and the second polish-stop layer 164 are patterned to form the plurality of wiring holes 562H.

The plurality of wiring holes 562H include at least one first wiring hole 562H1 and at least one second wiring hole 562H2. The first wiring hole 562H1 partially exposes the protective film pattern 520A at the inlet of the via hole 130, the first barrier film 142 surrounding a side wall of the protective film pattern 520A, the insulating film 138 formed around the first barrier film 142, and the interlayer insulating film 114. The second wiring hole 562H2 may expose at least one of the plurality of individual devices 112 formed on the substrate 102 and a conductive layer (not shown) or a conductive region (not shown) electrically connected to the at least one individual device.

In some embodiments, the inter-metal insulating film 162 is formed of TEOS, and the second polish-stop layer 164 is a silicon oxynitride film.

Figure 5D:
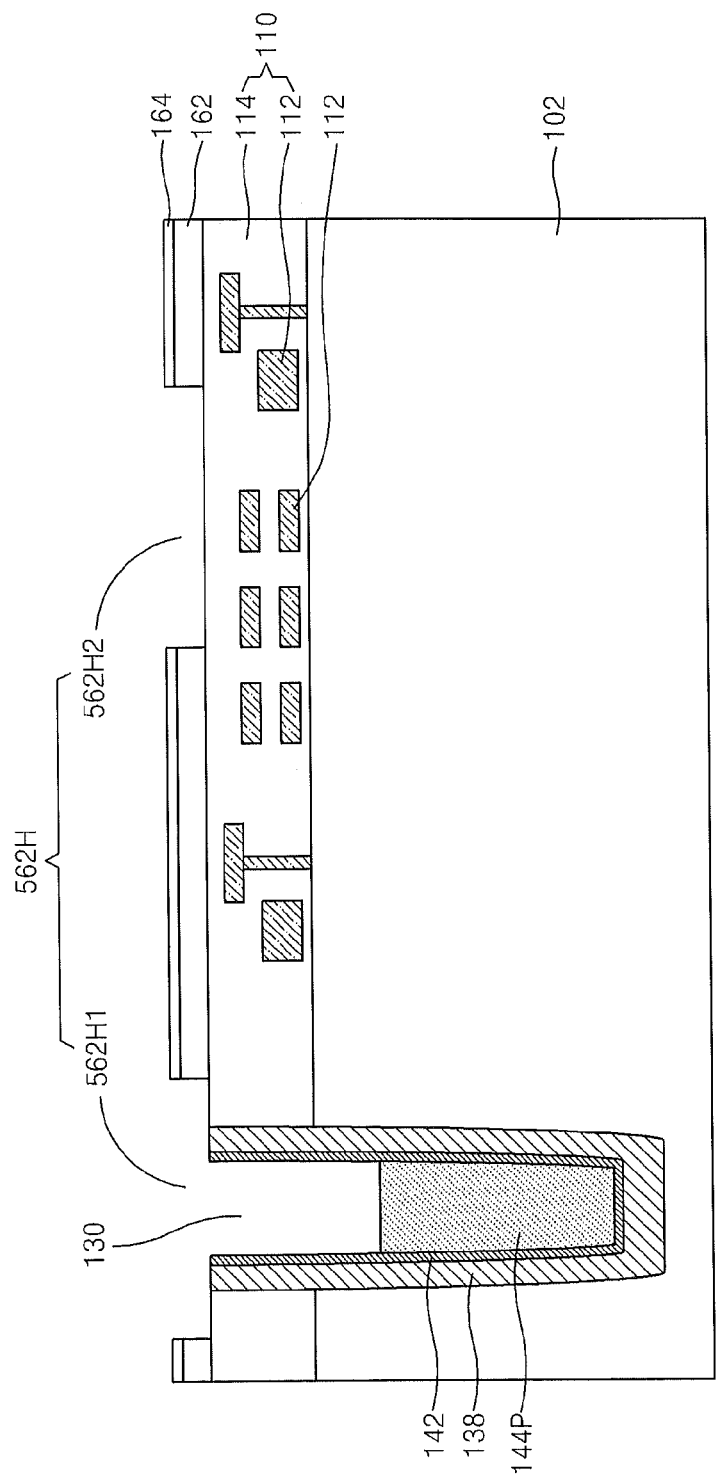

Referring to FIG. 5D, the top surface 144T of the first conductive plug 144P and a surface of the first barrier film 142 are exposed in the via hole 130 by removing the protective film pattern 520A remaining in the via hole 130 through the first wiring hole 562H1.

In some embodiments, in order to remove the protective film pattern 520A, the protective film pattern 520A is stripped under a process condition in which there is an etch selectivity with respect to each of the interlayer insulating film 114 exposed through a plurality of wiring holes 562H, the inter-metal insulating film 162 formed on the interlayer insulating film 114, and the second polish-stop layer 164.

Figure 5E:
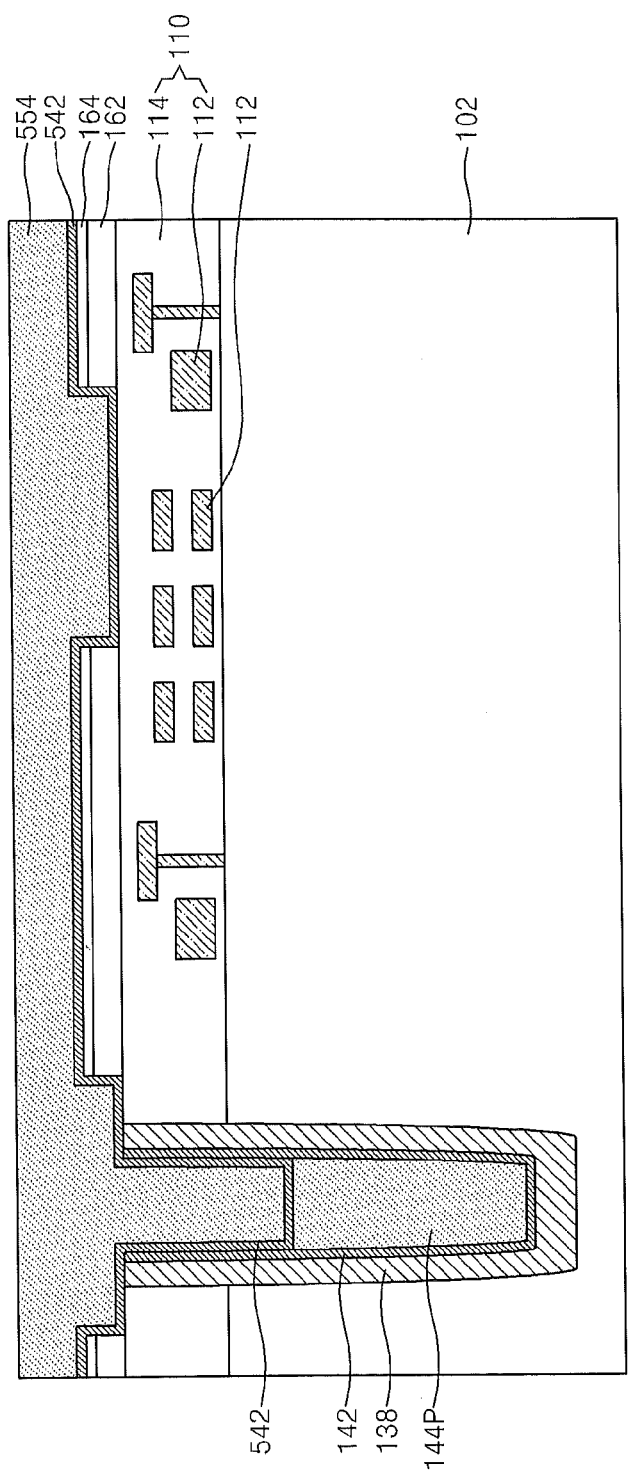

Referring to FIG. 5E, a second barrier film 542 is formed on a resultant structure including the inter-metal insulating film 162 having the plurality of wiring holes 562H and the second polish-stop layer 164, and then a second conductive layer 554 is formed on the second barrier film 542.

In some embodiments, in order to form the second barrier film 542 and the second conductive layer 554, processes similar to the processes of forming the second barrier film 442 and the reflow second conductive layer 454A described with reference to FIGS. 4A and 4B are performed.

The first barrier film 542 is formed along inner surfaces of the first wiring hole 562H1 and the second wiring hole 562H2 (see FIG. 5D). The second conductive layer 554 is formed to have an enough thickness to fill the via hole 130, the first wiring hole 562H1, and the second wiring hole 562H2.

In some embodiments, the second conductive layer 554 is formed to include the same metal as a metal constituting the first conductive plug 144P. For example, the second conductive layer 554 may be a Cu film.

Figure 5F:
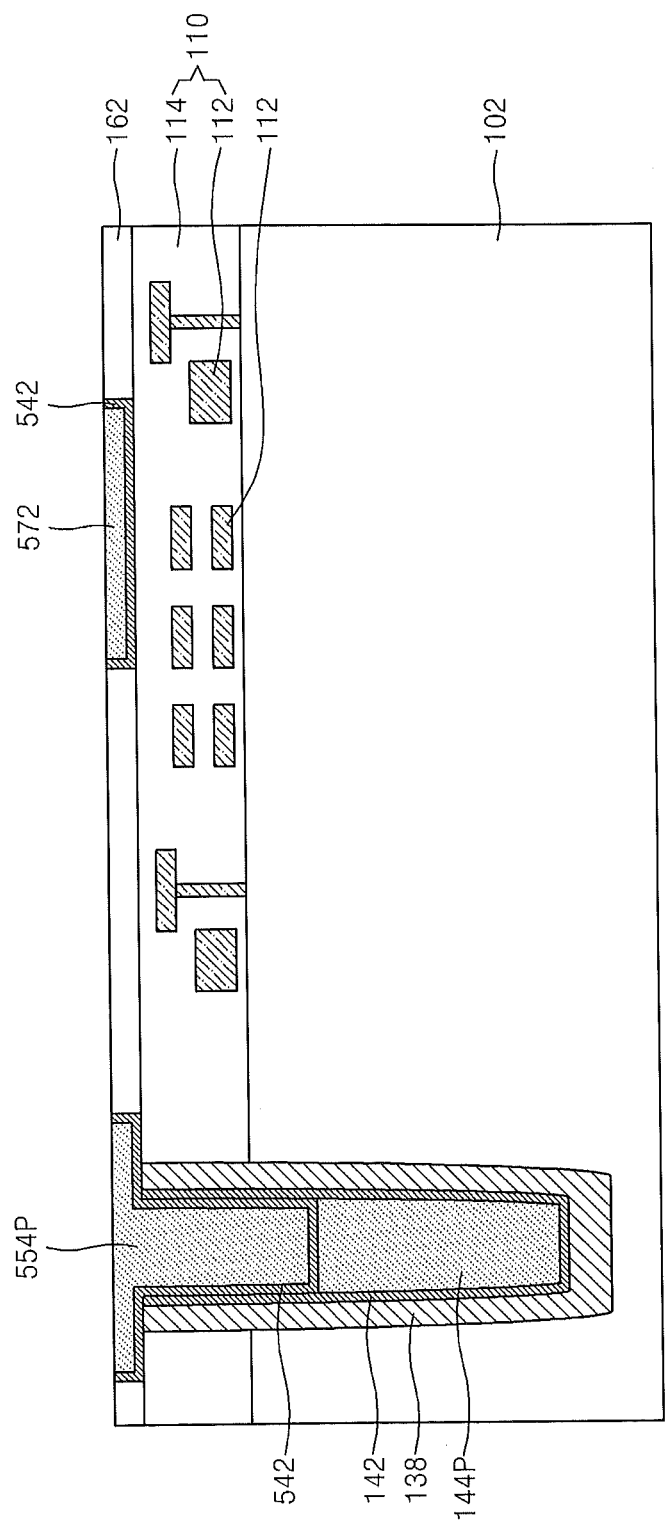

Referring to FIG. 5F, only the second conductive layer 554 and the second barrier film 542 remain in the plurality of wiring holes 562H by polishing a resultant structure including the second conductive layer 554 and the second barrier film 542 by performing a CMP process by using the second polish-stop layer 164 as a stopper and removing the second polish-stop layer 164. As a result, a second conductive plug 554P electrically connected to the first conductive plug 144P is formed in an upper space of the via hole 130 and the first wiring hole 562H1, and a wiring metal layer 572 is formed in the second wiring hole 562H2. A bottom surface and a side wall of each of the second conductive plug 554P and the wiring metal layer 572 are surrounded by the second barrier film 542. After the CMP process, the second polish-stop layer 164 is removed and a top surface of the inter-metal insulating film 162 is exposed.

Figure 5G:
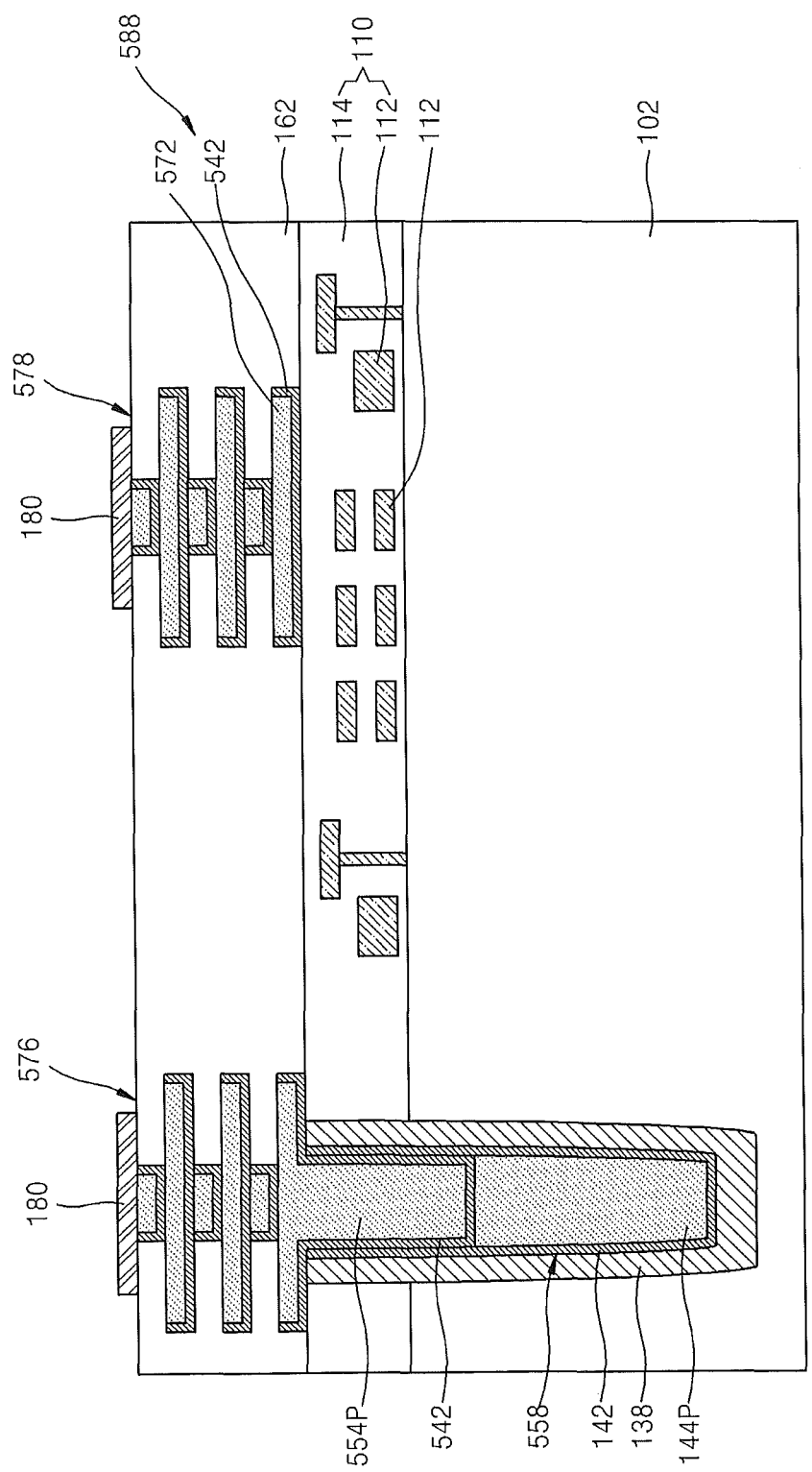

Referring to FIG. 5G, by using a process similar to that described with reference to FIG. 1K, a first multi-layer wiring pattern 576 electrically connected to the second conductive plug 554P and a second multi-layer wiring pattern 578 including the wiring metal layer 572 are simultaneously formed, and a BEOL structure 588 including the first multi-layer wiring pattern 576, the second multi-layer wiring pattern 578, and the inter-metal insulating film 162 for insulating the first multi-layer wiring pattern 576 and the second multi-layer wiring pattern 578 is formed.

Figure 5H:
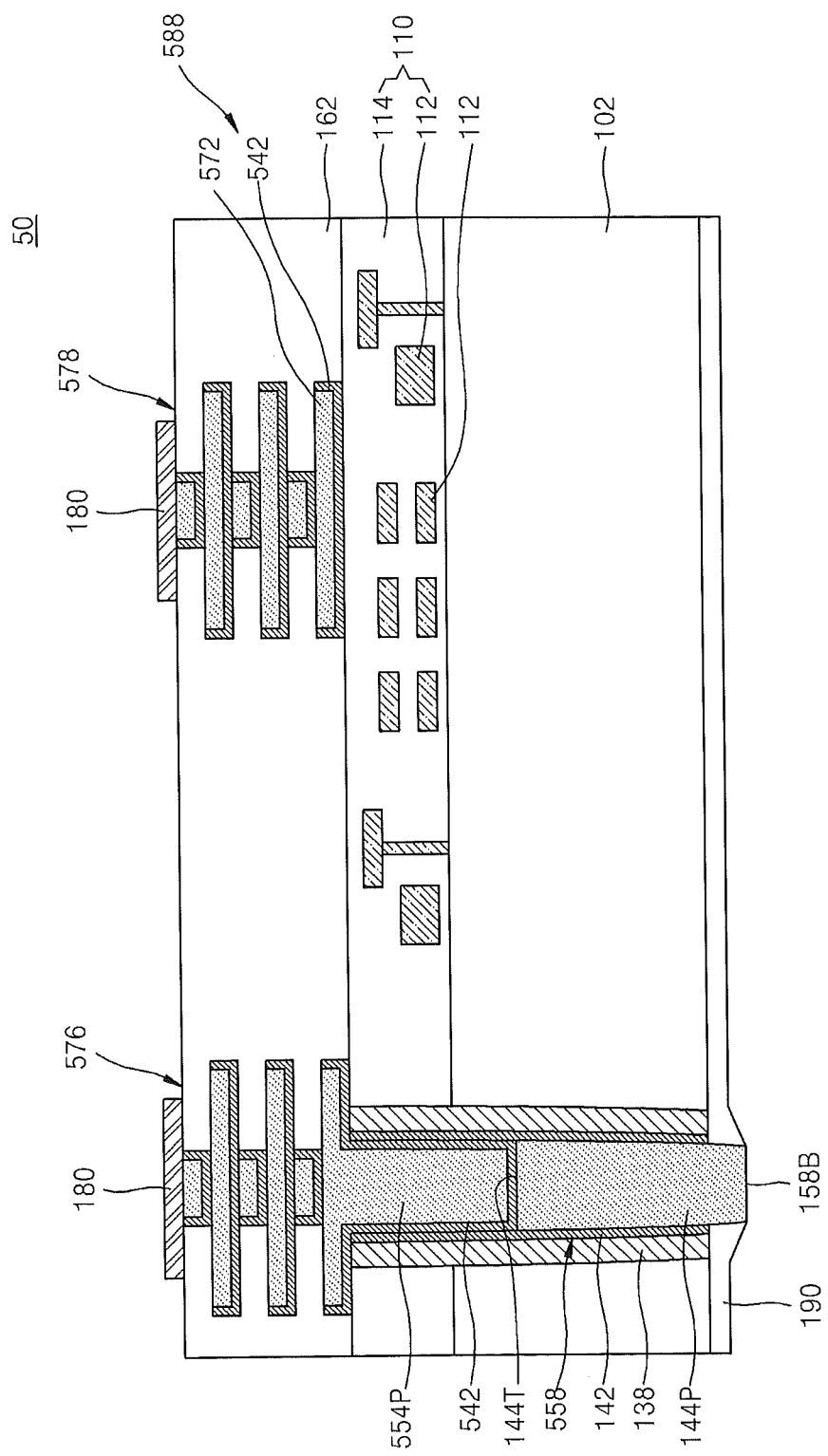

Referring to FIG. 5H, by performing processes similar to those described with reference to FIGS. 1L and 1M, the integrated circuit device 50 is formed.

In the integrated circuit device 50, the TSV structure 558 includes a first through-electrode portion including the first conductive plug 144P having the top surface 144T located in the first hole 132 (see FIG. 1B) and the side wall surrounded by the first barrier film 142, and a second through-electrode portion including the second conductive plug 554P having a side wall surrounded by the first barrier film 142 and extending from a top surface of the first through-electrode portion including the first conductive plug 144P to the second hole 134 (see FIG. 1B). The second conductive plug 554P of the second through-electrode portion has a top surface located at a level higher than that of the top surface of the inter-metal insulating film 162.

The second through-electrode portion further includes the second barrier film 542 that surrounds at least a portion of the second conductive plug 554P. The second barrier film 542 contacts the top surface 144T of the first conductive plug 144P and the first barrier film 142. The first conductive plug 144P and the second conductive plug 554P include the same metal. The second barrier film 542 may include a metal having an adhesive force to the first barrier film 142 greater than that of a metal constituting the first conductive plug 144P. Accordingly, it is possible to prevent delamination between different films in the TSV structure 558. Also, since the TSV structure 558 is formed by forming the second conductive plug 554P on the first conductive plug 144P after metal grains constituting the first conductive plug 144P are sufficiently grown, defects due to extrusion of the TSV structure 558 caused by undesired growth of the metal grains may be avoided.

Figure 6:
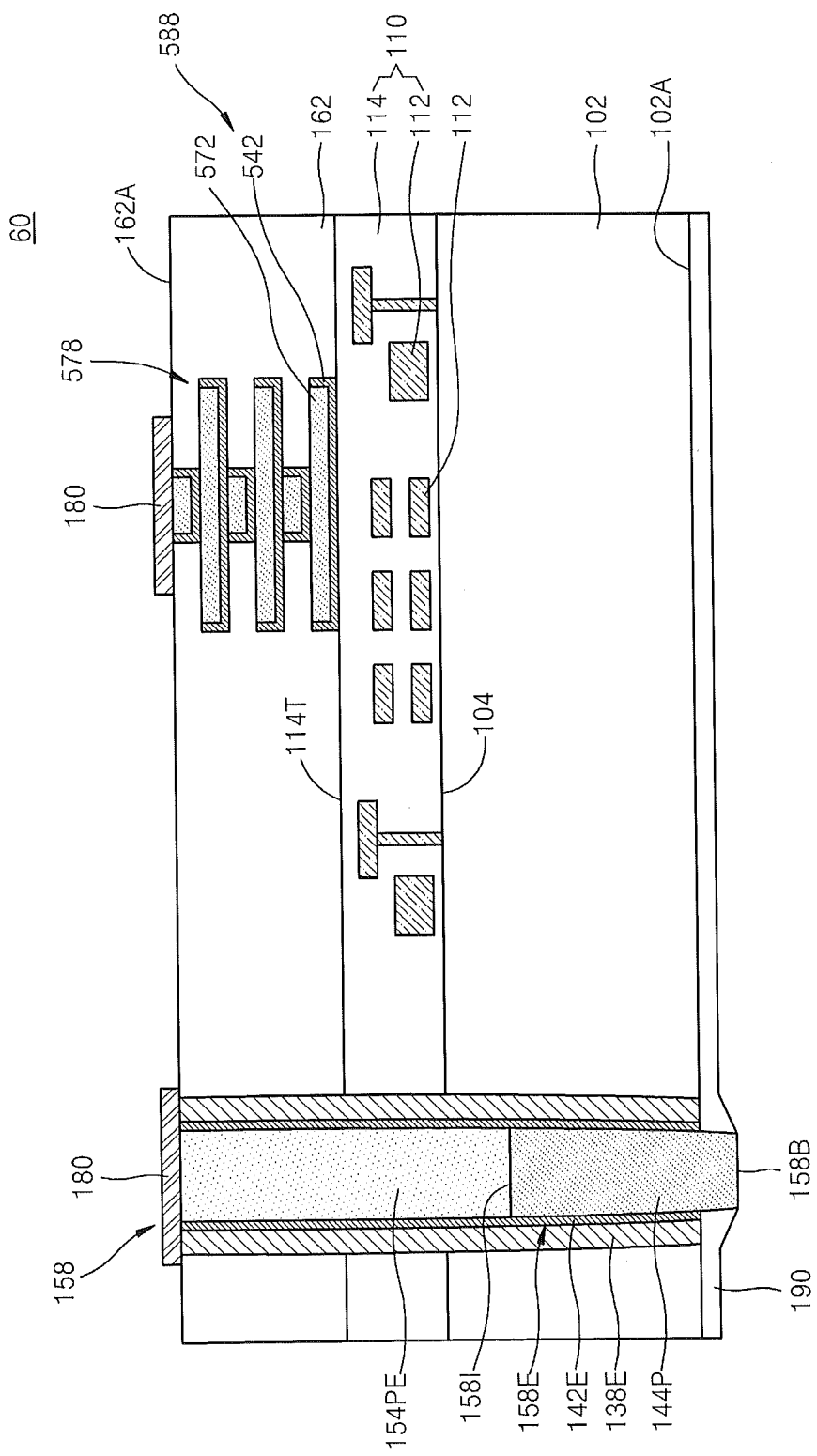
FIG. 6 is a cross-sectional view illustrating an integrated circuit device according to another embodiment of the inventive concept.

FIG. 6 is a cross-sectional view illustrating an integrated circuit device 60 according to another embodiment of the inventive concept. In FIG. 6, the same members as those in FIGS. 1A through 5H are denoted by the same reference numerals, and thus in order to avoid repeated explanation, a detailed explanation thereof will not be given.

In the integrated circuit device 60, a TSV structure 158E includes a first through-electrode portion including the first conductive plug 144P and a second through-electrode portion including a second conductive plug 154PE.

The first conductive plug 144P is surrounded by a first barrier film 142E and an insulating film 138E each of which extends from the bottom surface 102B of the substrate 102 to a top surface of a BEOL structure 588.

Details about the first barrier film 142E, the insulating film 138E, and the second conductive plug 154PE are substantially the same as those of the first barrier film 142, the insulating film 138, and the second conductive plug 154P described with reference to FIGS. 1A through 1M. The first conductive plug 144P has the side wall surrounded by the first barrier film 142E and the top surface 144T located at a level lower than that of the top surface of the substrate 102. The second conductive plug 154PE has a side wall surrounded by the first barrier film 142E, and extends from the top surface 144T of the first conductive plug 144P to pass through a hole formed in the interlayer insulating film 114 and a hole formed in the inter-metal insulating film 162 of the BEOL structure 588. The second conductive plug 154PE constitutes the second through-electrode portion.

In order to form the TSV structure 158E, after the BEOL structure 588 is formed, a hole that extends through the BEOL structure 588 and the interlayer insulating film 114 to a predetermined level in the substrate 102 may be formed by etching the BEOL structure 588, the interlayer insulating film 114, and the substrate 102 by using processes similar to those described with reference to FIGS. 1A and 1B, and then processes similar to those described with reference to FIGS. 1C through 1M may be performed.

The first conductive plug 144P and the second conductive plug 154PE include different metals. The second conductive plug 154PE may include a metal having an adhesive force to the first barrier film 142E greater than that of a metal constituting the first conductive plug 144P. Accordingly, it is possible to prevent delamination between different films in the TSV structure 158E. Also, since the TSV structure 158E is formed by forming the second conductive plug 154PE on the first conductive plug 144P after metal grains constituting the first conductive plug 144P are sufficiently grown, defects due to extrusion of the TSV structure 158E caused by undesired growth of the metal grains may be avoided.

FIG. 6 may also be regarded as illustrating an integrated circuit device according to other embodiments of the inventive concept that includes a substrate 102 and an insulating layer 114 on the substrate 102, to define a substrate outer face 102A, an insulating layer outer face 114A and a device interface 104 therebetween. A TSV structure 158 passes through the substrate 102 and the insulating layer 114. The TSV structure 158 comprises a first plug 144P that extends from adjacent the substrate outer face 102A towards the insulating layer outer face 114A, and a second plug 154PE that extends from adjacent the insulating layer outer face 114A towards the substrate outer face 102A, to define a plug interface 158I therebetween that is offset from the device interface 104. The first and second plugs 144P and 154PE may comprise different metals. The plug interface 158I may be between the substrate outer face 102A and the device interface 104. As used herein, "offset" means that the plug interface is at a different depth than the device interface 104, relative to the substrate outer face 102A and/or the insulating layer outer face 114A. A barrier layer 142 may be provided on side walls of the first and second plugs 144P and 154P, respectively.

Moreover, in FIG. 6, the insulating layer 114 comprises an interlayer insulating film and the integrated circuit device 60 further comprises an inter-metal insulating film 162 on the interlayer insulating film 114, to define an inter-metal insulating film outer face 162A, wherein the second plug 154PE further extends from adjacent the inter-metal insulating film outer face 162A and through the inter-metal insulating film 162.

Figure 7:
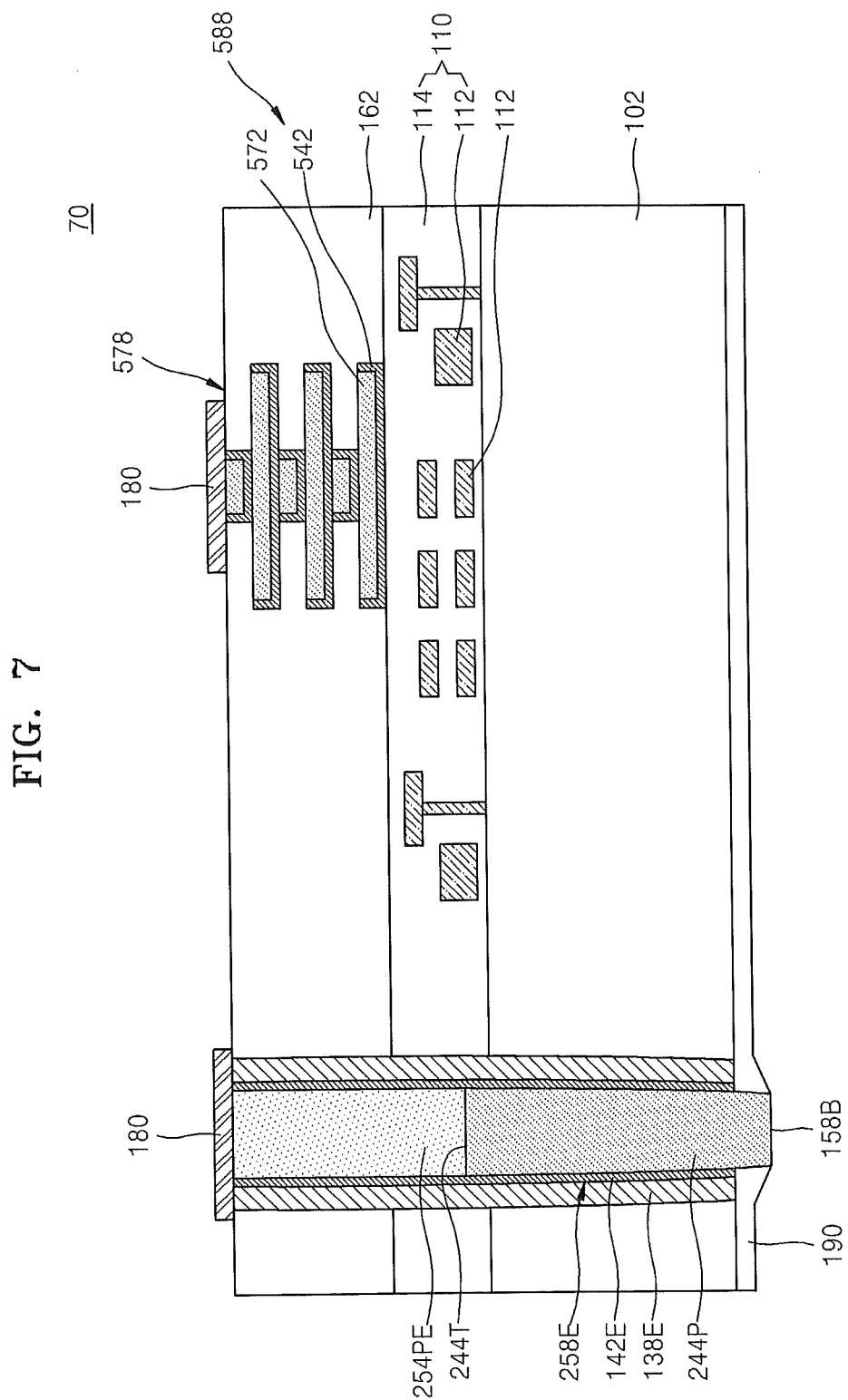
FIG. 7 is a cross-sectional view illustrating an integrated circuit device according to another embodiment of the inventive concept.

FIG. 7 is a cross-sectional view illustrating an integrated circuit device 70 according to another embodiment of the inventive concept. In FIG. 7, the same members as those in FIGS. 1A through 6 are denoted by the same reference numerals, and thus in order to avoid repeated explanation, a detailed explanation thereof will not be given.

In the integrated circuit device 70, a TSV structure 258E includes a first through-electrode portion including a first conductive plug 244P and a second through-electrode portion including a second conductive plug 254PE.

Details about the first conductive plug 244P and the second conductive plug 254PE are the same as those described with reference to FIG. 2. The second conductive plug 254PE has a side wall surrounded by the first barrier film 142E, and extends from a top surface 244T of the first conductive plug 244P to pass through a hole formed in the interlayer insulating film 114 and a hole formed in the inter-metal insulating film 162 of the BEOL structure 588. The second conductive plug 254PE constitutes the second through-electrode portion.

In order to form the TSV structure 258E, after the BEOL structure 588 is formed, a hole that extends through the BEOL structure 588 and the interlayer insulating film 114 to a predetermined level in the substrate may be formed by etching the BEOL structure 588, the interlayer insulating film 114, and the substrate 102 by using processes similar to those described with reference to FIGS. 1A and 1B, and processes similar to those described with reference to FIGS. 1C through 1F and FIG. 2 may be performed.

Figure 8:
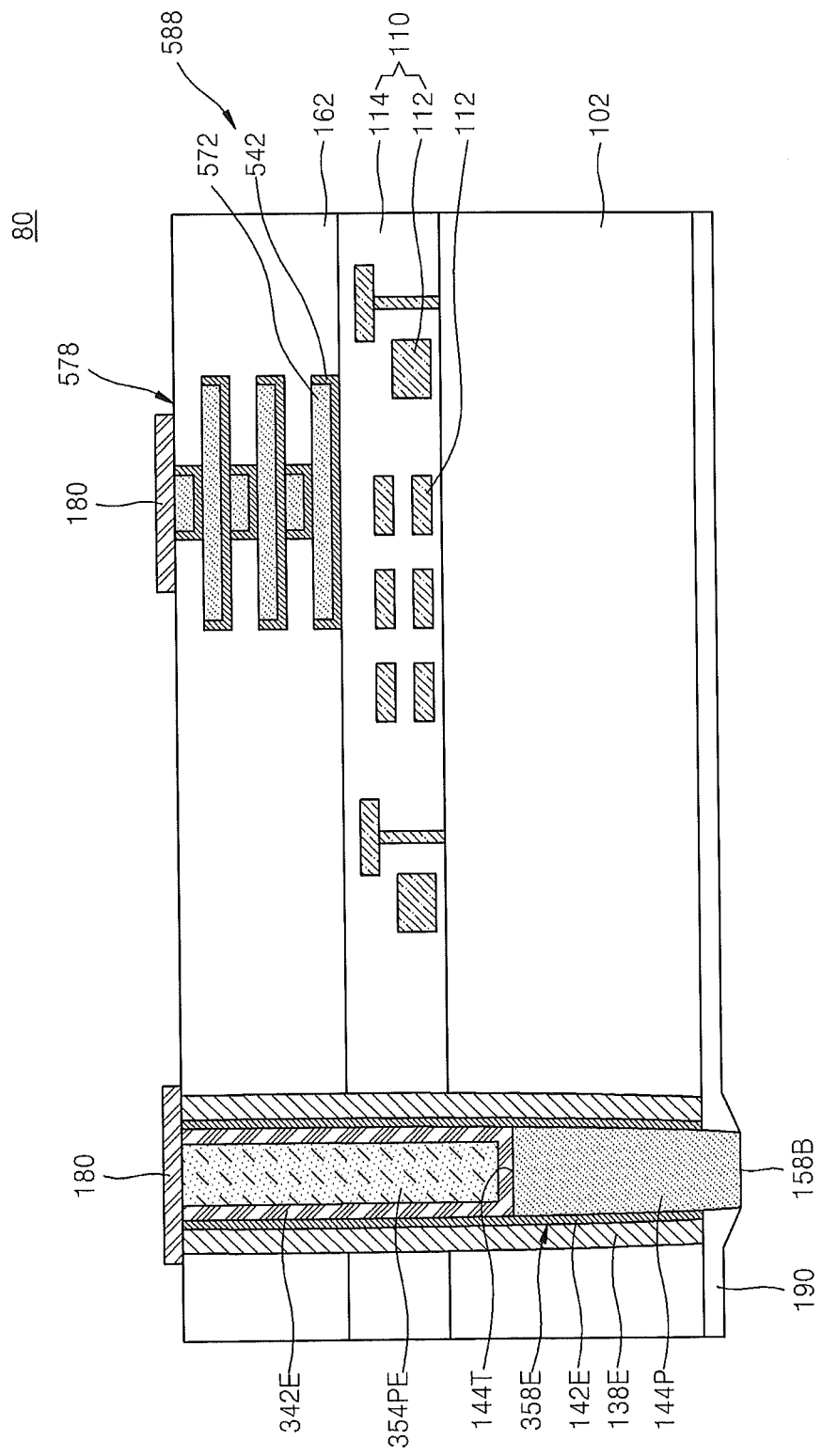
FIG. 8 is a cross-sectional view illustrating an integrated circuit device according to another embodiment of the inventive concept.

FIG. 8 is a cross-sectional view illustrating an integrated circuit device 800 according to another embodiment of the inventive concept. In FIG. 8, the same members as those in FIGS. 1A through 6 are denoted by the same reference numerals, and thus in order to avoid repeated explanation, a detailed explanation thereof will not be given.

In the integrated circuit device 80, a TSV structure 358E includes a first through-electrode portion including the first conductive plug 144P and a second through-electrode portion including a second conductive plug 354PE.

A structure of the second conductive plug 354PE is substantially the same as that of the second conductive plug 354P described with reference to FIGS. 3A through 3E. The second conductive plug 354PE has a side wall surrounded by the first barrier film 142E, and extends from the top surface 144T of the first conductive plug 144P to pass through a hole formed in the interlayer insulating film 114 and a hole formed in the inter-metal insulating film 162 of the BEOL structure 588. The second conductive plug 354PE constitutes the second through-electrode portion. The second through-electrode portion further includes a second barrier film 342E that surrounds at least a portion of the second conductive plug 354PE. The second barrier film 342E contacts the top surface 144T of the first conductive plug 144P and the first barrier film 142E. Details about the second barrier film 342E are substantially the same as those of the second barrier film 342 described with reference to FIGS. 3A through 3E.

In order to form the TSV structure 358E, after the BEOL structure 588 is formed, a hole that extends through the BEOL structure 588 and the interlayer insulating film 114 to a predetermined level in the substrate 102 may be formed by etching the BEOL structure 588, the interlayer insulating film 114, and the substrate 102 by using processes similar to those described with reference to FIGS. 1A and 1B, and processes similar to those described with reference to FIGS. 1C through 1F and FIGS. 3A through 3E may be performed.

The first conductive plug 144P and the second conductive plug 354PE may include different metals. Since the TSV structure 358E is formed by forming the second conductive plug 354PE on the first conductive plug 144P after metal grains constituting the first conductive plug 144P are sufficiently grown, defects due to extrusion of the TSV structure 358E caused by undesired growth of the metal grains may be avoided.

Figure 9:
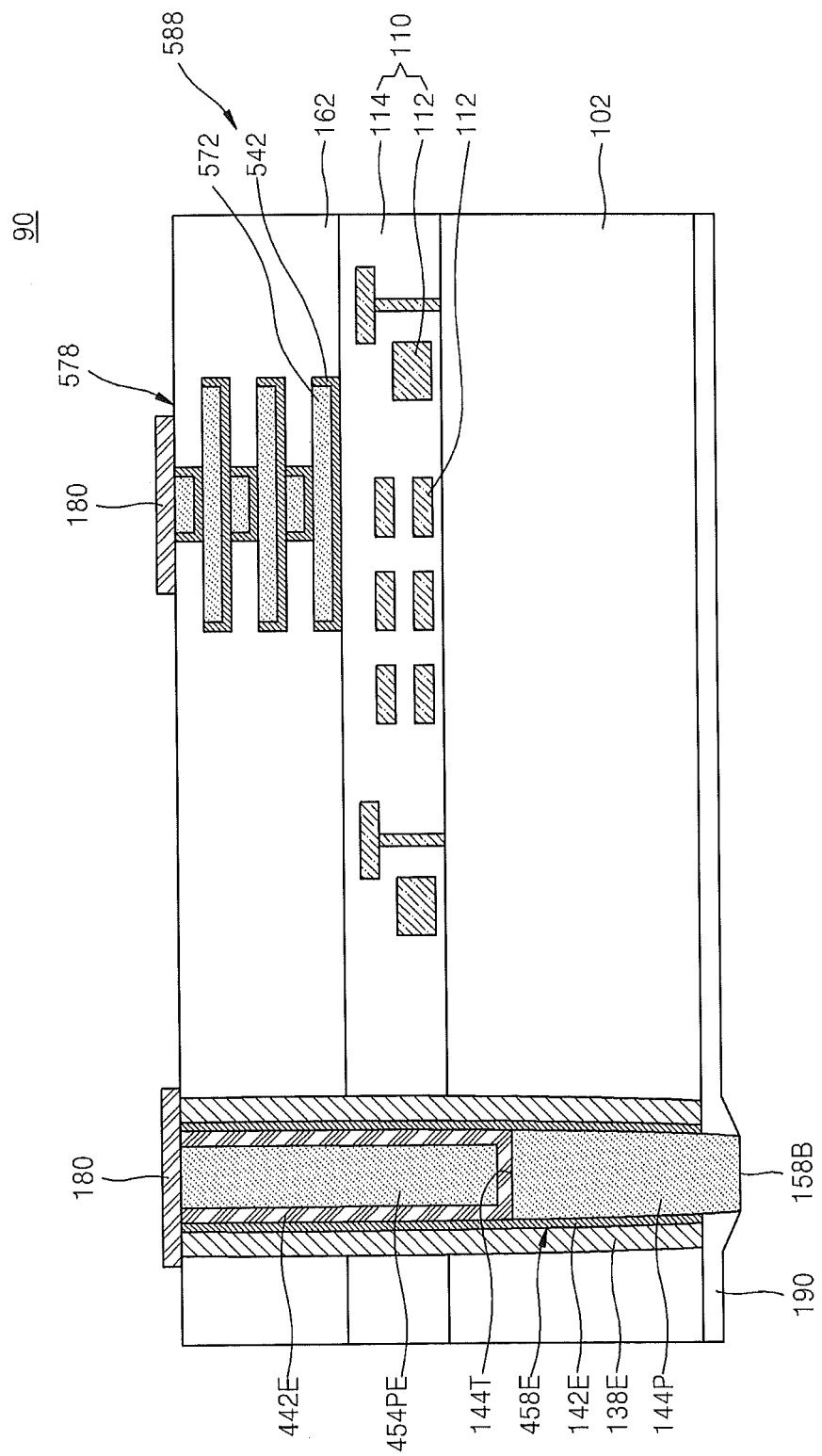
FIG. 9 is a cross-sectional view illustrating an integrated circuit device according to another embodiment of the inventive concept.

FIG. 9 is a cross-sectional view illustrating an integrated circuit device 90 according to another embodiment of the inventive concept. In FIG. 9, the same members as those in FIGS. 1A through 6 are denoted by the same reference numerals, and thus in order to avoid repeated explanation, a detailed explanation thereof will not be given.

In the integrated circuit device 90, a TSV structure 458E includes a first through-electrode portion including the first conductive plug 144P and a second through-electrode portion including a second conductive plug 454PE.

Details about the second conductive plug 454PE are substantially the same as those of the second conductive plug 454P described with reference to FIGS. 4A through 4D. The second conductive plug 454PE has a side wall surrounded by the first barrier film 142E, and extends from the top surface 144T of the first conductive plug 144P to pass through a hole formed in the interlayer insulating film 114 and a hole formed in the inter-metal insulating film 162 of the BEOL structure 588. The second conductive plug 454PE constitutes the second through-electrode portion. The second through-electrode portion further includes a second barrier film 442E that surrounds at least a portion of the second conductive plug 454PE. The second barrier film 442E contacts the top surface 144T of the first conductive plug 144P and the first barrier film 142E. Details about the second barrier film 442E are substantially the same as those of the second barrier film 442 described with reference to FIGS. 4A through 4D.

In order to form the TSV structure 458E, after the BEOL structure 588 is formed, a hole that extends through the BEOL structure 588 and the interlayer insulating film 114 to a predetermined level in the substrate 102 may be formed by etching the BEOL structure 588, the interlayer insulating film 114, and the substrate 102 by using processes similar to those described with reference to FIGS. 1A and 1B, and processes similar to those described with reference to FIGS. 1C through 1F and FIGS. 4A through 4D may be performed.

The first conductive plug 144P and the second conductive plug 454PE include the same metal. Also, since the TSV structure 458E is formed by forming the second conductive plug 454PE on the first conductive plug 144P after metal grains constituting the first conductive plug 144P are sufficiently grown, defects due to extrusion of the TSV structure 458E caused by undesired growth of the metal grains may be avoided.

Figure 10:
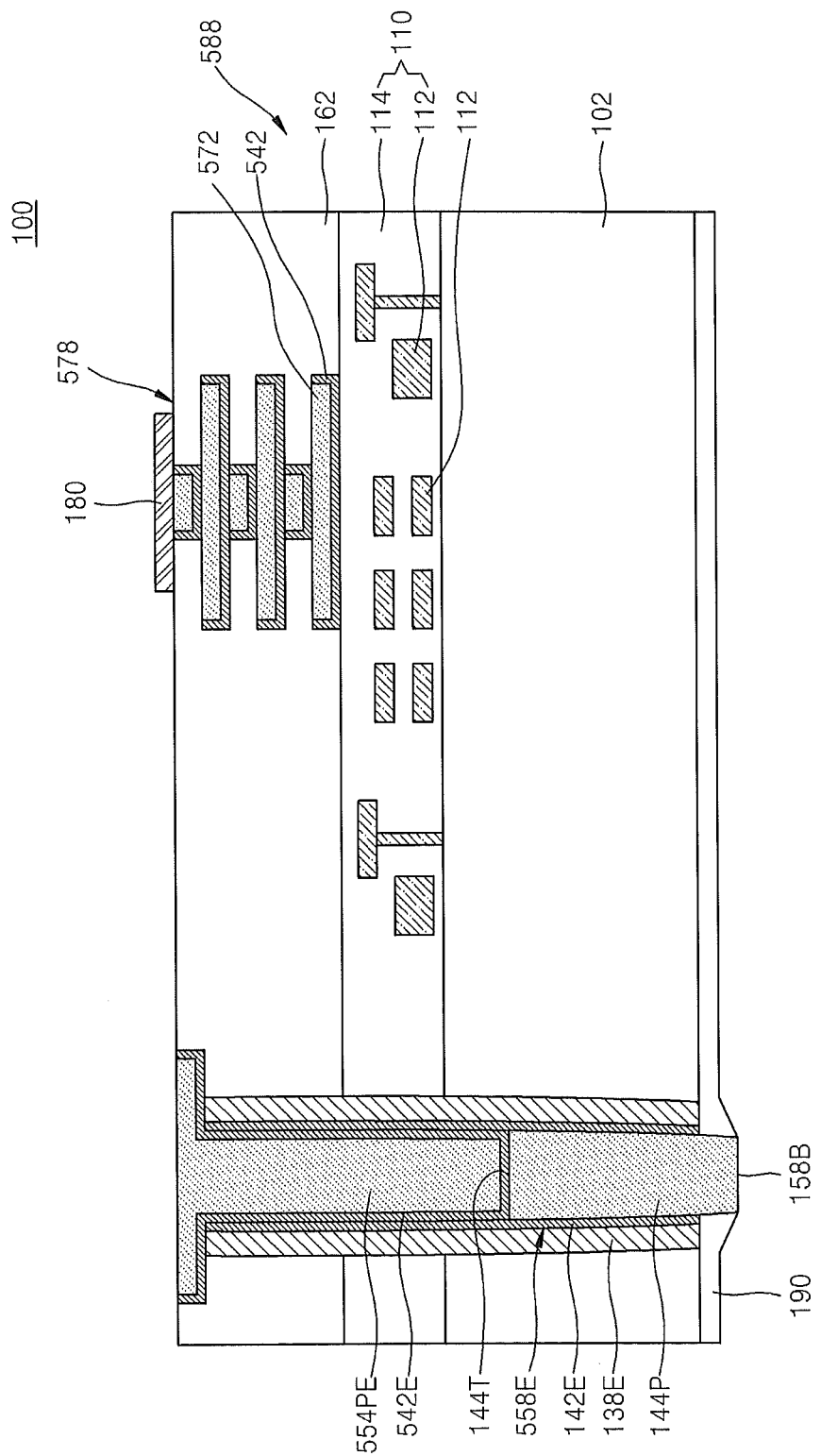
FIG. 10 is a cross-sectional view illustrating an integrated circuit device according to another embodiment of the inventive concept.

FIG. 10 is a cross-sectional view illustrating an integrated circuit device 100 according to another embodiment of the inventive concept. In FIG. 10, the same members as those in FIGS. 1A through 6 are denoted by the same reference numerals, and thus in order to avoid repeated explanation, a detailed explanation thereof will not be given.

In the integrated circuit device 100, a TSV structure 558E includes a first through-electrode portion including the first conductive plug 144P and a second through-electrode portion including a second conductive plug 554PE.

Details about the second conductive plug 554PE are substantially the same as those of the second conductive plug 554P described with reference to FIGS. 5A through 5H, excepting that the second conductive plug 554PE has a side wall surrounded by the first barrier film 142E and extends from the top surface 144T of the first conductive film 144P to pass through a hole formed in the interlayer insulating film 114 and a hole formed in the inter-metal insulating film 162 of the BEOL structure 588. The second conductive plug 554PE constitutes the second through-electrode portion. The second through-electrode portion further includes a second barrier film 542E that surrounds at least a portion of the second conductive plug 554PE. The second barrier film 542E contacts the top surface 144T of the first conductive plug 144P and the first barrier film 142E. Details about the second barrier film 542E are substantially the same as those of the second barrier film 542 described with reference to FIGS. 5A through 5H.

In order to form the TSV structure 558E, after the BEOL structure 588 is formed, a hole that extends through the BEOL structure 588 and the interlayer insulating film 114 to a predetermined level in the substrate 102 may be formed by etching the BEOL structure 588, the interlayer insulating film 114, and the substrate 102 by using processes similar to those described with reference to FIGS. 1A and 1B, and processes similar to those described with reference to FIGS. 1C through 1F and FIGS. 5A through 5H may be performed.

In FIG. 10, the second conductive plug 554PE of the second through-electrode portion has a top surface located at substantially the same level as that of the top surface of the inter-metal insulating film 162. However, the inventive concept is not limited thereto. In some embodiments, the second conductive plug 554PE of the second through-electrode portion may be formed to have a top surface located at a level higher than that of the top surface of the inter-metal insulating film 162.

The first conductive plug 144P and the second conductive plug 554PE include the same metal. Since the TSV structure 558E is formed by forming the second conductive plug 554PE on the first conductive plug 144P after metal grains constituting the first conductive plug 144P are sufficiently grown, defects due to extrusion of the TSV structure 558E caused by undesired growth of the metal grains may be avoided.

Figure 11:
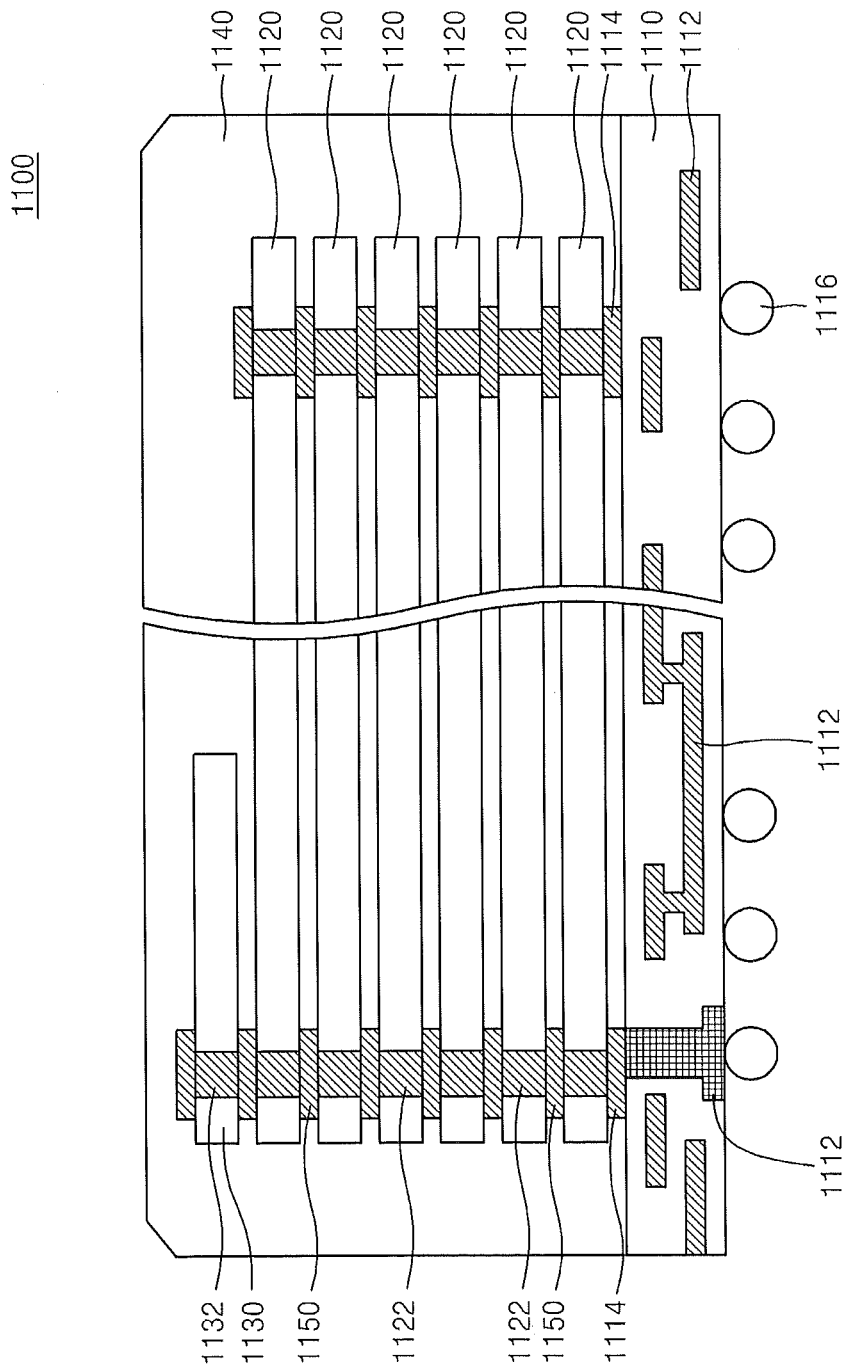
FIG. 11 is a cross-sectional view illustrating an integrated circuit device according to another embodiment of the inventive concept.

FIG. 11 is a cross-sectional view illustrating an integrated circuit device 1100 according to another embodiment of the inventive concept.

Referring to FIG. 11, the integrated circuit device 1100 includes a plurality of semiconductor chips 1120 sequentially stacked on a package substrate 1110. Control chip 1130 is mounted on the plurality of semiconductor chips 1120. A structure in which the plurality of semiconductor chips 1120 and the control chip 1130 are stacked is sealed by an encapsulant 1140 such as thermosetting resin on the package substrate 1110. Although FIG. 11 illustrates six semiconductor chips 1120 vertically stacked on one another, the number of the semiconductor chips 1120 and the direction to which the semiconductor chips 1120 are directed are not limited thereto. The number of the semiconductor chips 1120 may be less or greater than 6 as desired. The plurality of semiconductor chips 1120 may be arranged in a horizontal direction on the package substrate 1110, or may be arranged in a combination of a horizontal direction and a vertical direction. In some embodiments, the control chip 1130 may be omitted.

The package substrate 1110 may be a flexible printed circuit board, a rigid printed circuit board, or a combination of a flexible printed circuit board and a rigid printed circuit board. The package substrate 1110 includes substrate wirings 1112 and connection terminals 1114. The connection terminals 1114 may be formed on a surface of the package substrate 1110. Solder balls 1116 are formed on the other surface of the package substrate 1110. The connection terminals 1114 are electrically connected to the solder balls 1116 through the substrate wirings 1112.

In some embodiments, the solder balls 1116 may be replaced by conductive bumps or a lead grid array (LGA).

At least one of the plurality of semiconductor chips 1120 and the control chip 1130 includes at least one of the integrated circuit devices 10, 20, 30, 40, 50, 60, 70, 80, 90, and 100 described with reference to FIGS. 1A through 10. In particular, each of the plurality of semiconductor chips 1120 and the control chip 1130 includes TSV structures 1122 and 1132, respectively. At least one of the TSV structures 1122 and 1132 includes at least one of the TSV structures 158, 258, 358, 458, and 558 described with reference to FIGS. 1A through 10.

The TSV structures 1122 and 1132 of the plurality of semiconductor chips 1120 and the control chip 1130 may be electrically connected to the connection terminals 1114 of the package substrate 1110 by connection members 1150 such as bumps.

Each of the plurality of semiconductor chips 1120 may include a system LSI, a flash memory, a dynamic random access memory (DRAM), a static random access memory (SRAM), an electrically-erasable programmable read-only memory (EEPROM), a phase-change random access memory (PRAM), a magnetic random access memory (MRAM), or a resistive random access memory (RRAM). The control chip 1130 may include logic circuits such as a serializer/deserializer (SER/DES) circuit.

Figure 12:
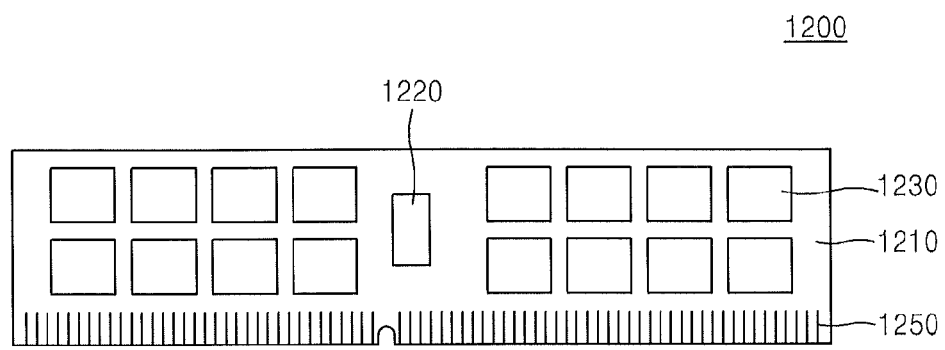
FIG. 12 is a cross-sectional view illustrating an integrated circuit device according to another embodiment of the inventive concept.

FIG. 12 is a plan view illustrating an integrated circuit device 1200 according to another embodiment of the inventive concept.

The integrated circuit device 1200 includes a module substrate 1210, and a control chip 1220 and a plurality of semiconductor packages 1230 mounted on the module substrate 1210. A plurality of input/output terminals 1250 are formed on the module substrate 1210.

Each of the plurality of semiconductor packages 1230 includes at least one of the integrated circuit devices 10, 20, 30, 40, 50, 60, 70, 80, 90, 100, and 1100. In particular, at least one of the plurality of semiconductor packages 1230 includes at least one of the TSV structures 158, 258, 358, 458, and 558 described with reference to FIGS. 1A through 10.

Figure 13:
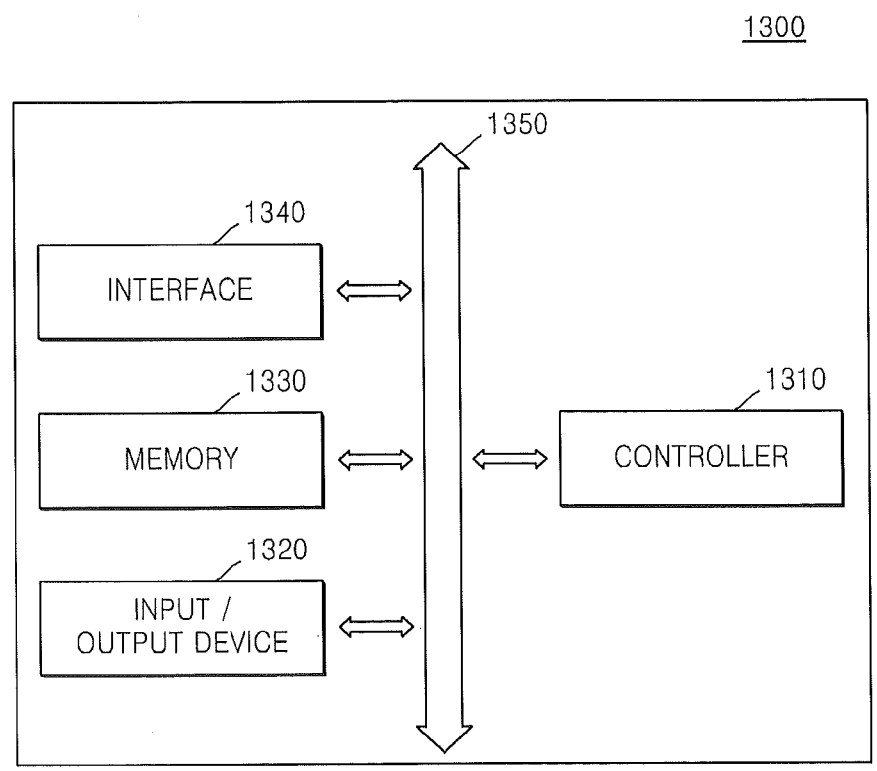
FIG. 13 is a block diagram of an integrated circuit device according to another embodiment of the inventive concept.

FIG. 13 is a block diagram illustrating an integrated circuit device 1300 according to another embodiment of the inventive concept.

The integrated circuit device 1300 includes a controller 1310, an input/output device 1320, a memory 1330, and an interface 1340. The integrated circuit device 1300 may be a mobile system or a system that transmits or receives information. In some embodiments, the mobile system is at least one of a personal digital assistant (PDA), a portable computer, a web tablet, a wireless phone, a mobile phone, a digital music player, and a memory card.

In some embodiments, the controller 1310 is a microprocessor, a digital signal processor, or a microcontroller.

The input/output device 1320 is used to input/output data to/from the integrated circuit device 1300. The integrated circuit device 1300 may be connected to an external device such as a personal computer or a network by using the input/output device 1320, and may exchange data with the external device. In some embodiments, the input/output device 1320 is a keypad, a keyboard, or a display device.

In some embodiments, the memory 1330 stores code and/or data for operating the controller 1310. In another embodiment, the memory 1330 stores data processed by the controller 1310. At least one of the controller 1310 and the memory 1330 includes at least one of the integrated circuit devices 10, 20, 30, 40, 50, 60, 70, 80, 90, 100, 1100, 1200 described with reference to FIGS. 1A through 12. In particular, at least one of the controller 1310 and the memory 1330 is an electronic system including a semiconductor package including at least one of the TSV structures 158, 258, 358, 458, and 558 described with reference to FIGS. 1A through 10.

The interface 1340 acts as a path through which data is transmitted between the integrated circuit device 1300 and another external device. The controller 1310, the input/output device 1320, the memory 1330, and the interface 1340 may communicate with one another via a bus 1350.

The integrated circuit device 1300 may be included in a mobile phone, an MP3 player, a navigation system, a portable multimedia player (PMP), a solid-state disc (SSD), and household appliances.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. An integrated circuit device comprising:
a substrate through which a first through-hole extends;
an interlayer insulating film on the substrate, the interlayer insulating film having a second through-hole communicating with the first through-hole; and
a Through-Silicon Via (TSV) structure in the first through-hole and the second through-hole, the TSV structure extending to pass through the substrate and the interlayer insulating film,
wherein the TSV structure comprises:
an insulating liner on a sidewall of the first through-hole and the second through-hole;
a first through-electrode portion on the insulating liner and having a top surface located in the first through-hole; and
a second through-electrode portion on the insulating liner and having a bottom surface contacting with the top surface of the first through-electrode portion and extending from the bottom surface to at least the second through-hole;

wherein the TSV structure further comprises a first barrier film extending on the insulating liner from the first through-hole to at least the second through-hole, wherein the first through-electrode portion has a first conductive plug having a side wall surrounded by the first barrier film and including a first metal, and wherein the second through-electrode portion has a second conductive plug having a side wall surrounded by the first barrier film and including a second metal.

2. The integrated circuit device of claim 1, wherein the first through-electrode portion has a first conductive plug having a first metal, and wherein the second through-electrode portion has a second conductive plug having a second metal different from the first metal.

3. The integrated circuit device of claim 2, wherein the second conductive plug further includes a third metal different from the first metal and the second metal.

4. The integrated circuit device of claim 2, wherein the first conductive plug includes copper (Cu), and the second conductive plug includes molybdenum (Mo), tantalum (Ta), tungsten (W) and/or nickel (Ni).

5. The integrated circuit device of claim 1, wherein the second through-electrode portion further has a second barrier film surrounding at least a portion of the second conductive plug and contacting with a top surface of the first conductive plug and with the first barrier film.

6. The integrated circuit device of claim 5, wherein the first barrier film and the second barrier film include different materials.

7. The integrated circuit device of claim 1, wherein the first metal and the second metal are the same.

8. The integrated circuit device of claim 1, wherein the first conductive plug includes Cu, and the second conductive plug includes Cu and/or W.

9. The integrated circuit device of claim 1, wherein the second through-electrode portion has a top surface located at a same level as a level of a top surface of the interlayer insulating film.

10. The integrated circuit device of claim 1, wherein the second through-electrode portion has a top surface located at a level higher than a level of a top surface of the interlayer insulating film.

11. The integrated circuit device of claim 1, further comprising:

an inter-metal insulating film on the interlayer insulating film; and a multi-layer wiring pattern for through-electrode at a same level as a level of the inter-metal insulating film, the multi-layer wiring pattern for through-electrode being electrically connected to the second through-electrode portion.

12. The integrated circuit device of claim 1, further comprising an inter-metal insulating film on the interlayer insulating film, wherein the second through-electrode portion extends from the bottom surface of the second through-electrode portion through the second through-hole to pass through the inter-metal insulating film.

13. An integrated circuit device comprising:

a package substrate having a connection terminal; and at least one semiconductor chip having a substrate stacked on the package substrate, an interlayer insulating film on the substrate, and a Through-Silicon Via (TSV) structure passing through the substrate and the interlayer insulating film, the TSV structure being electrically connected to the connection terminal, wherein the TSV structure comprises:

an insulating liner passing through the substrate and the interlayer insulating film;

a barrier film on the insulating liner and passing through the substrate and the interlayer insulating film;

a first through-electrode portion having a side wall surrounded by the barrier film; and a second through-electrode portion having a side wall surrounded by the barrier film and extending from a top surface of the first through-electrode portion to at least a top surface of the interlayer insulating film.

14. The integrated circuit device of claim 13, wherein the first through-electrode portion includes a first metal, and the second through-electrode portion includes a second metal different from the first metal.

15. An integrated circuit device comprising:

a substrate;

an insulating layer on the substrate to define a substrate outer face, an insulating layer outer face and a device interface therebetween;

a Through-Silicon Via (TSV) structure that passes through the substrate and the insulating layer, the TSV structure comprising an insulating liner that passes through the substrate and the insulating layer, a first plug on the insulating liner that extends from adjacent the substrate outer face towards the insulating layer outer face, a second plug that extends from adjacent the insulating layer outer face towards the substrate outer face to define a plug interface therebetween that is offset from the device interface, and a barrier layer on sidewalls of the first and second plugs.

16. The integrated circuit device of claim 15 wherein the first and second plugs comprise different metals.

17. The integrated circuit device of claim 15 wherein the insulating layer comprises an interlayer insulating film, the integrated circuit device further comprising an inter-metal insulating film on the interlayer insulating film to define an inter-metal insulating film outer face, wherein the second plug further extends from adjacent the inter-metal insulating film outer face and through the inter-metal insulating film.

18. The integrated circuit device of claim 15 wherein the plug interface is between the substrate outer face and the device interface.

19. The integrated circuit device of claim 11 wherein the second through-electrode portion is integrally connected to the multi-layer wiring pattern for through-electrode.

* * * * *